United States Patent
Veres et al.

(10) Patent No.: US 7,332,369 B2
(45) Date of Patent: Feb. 19, 2008

(54) ORGANIC ELECTRONIC DEVICES

(75) Inventors: Janos Veres, Manchester (GB); Simon Dominic Ogier, Manchester (GB); Stephen George Yeates, Manchester (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 10/523,644

(22) PCT Filed: Jul. 30, 2003

(86) PCT No.: PCT/GB03/03317

§ 371 (c)(1),
(2), (4) Date: Sep. 6, 2005

(87) PCT Pub. No.: WO2004/013922

PCT Pub. Date: Feb. 12, 2004

(65) Prior Publication Data

US 2006/0105492 A1   May 18, 2006

(30) Foreign Application Priority Data

Aug. 6, 2002 (GB) ................... 0218202.0
Aug. 6, 2002 (GB) ................... 0218204.6

(51) Int. Cl.
*H01L 51/40* (2006.01)
(52) U.S. Cl. ......... 438/99; 257/E21.299; 257/E21.629; 257/E51.004
(58) Field of Classification Search .......... 438/99; 257/E21.299, E21.629, E21.643, E21.41, 257/E21.375, E51.005
See application file for complete search history.

(56) References Cited

U.S. PATENT DOCUMENTS 6,375,870 B1   4/2002   Visovsky et al.

(Continued)

FOREIGN PATENT DOCUMENTS

GB   2 373 095   9/2002

(Continued)

OTHER PUBLICATIONS

Holdcroft S: "Patterning Pi-Conjugated Polymers" Advanced Materials, VCH Verlagsgesellschaft, Weinheim, DE, vol. 13, No. 23, Dec. 3, 2001, pp. 1753-1765, XP001129588.

(Continued)

*Primary Examiner*—W. David Coleman
(74) *Attorney, Agent, or Firm*—Morgan, Lewis & Bockius LLP

(57) ABSTRACT

A method for forming an organic electronic device, which method comprises the steps of:
   a) forming a negative image of a desired pattern on a substrate or device layer with a lift-off ink;
   b) coating a first device layer to be patterned on top of the negative image;
   c) coating one or more further device layers to be patterned on top of the first device layer to be patterned; and
   d) removing the lift-off ink and unwanted portions of the device layers above it, thereby leaving the desired pattern of device layers.

The method allows the formation of a device structure wherein the device layers to be patterned are self-aligned. The method enables a multiplicity of layers to be patterned in a single set of printing and lift-off steps using one pattern which ensures the excellent vertical alignment of edges, which would be difficult to achieve by direct printing. Horizontal alignment can also be achieved. The size of the device features can be reduced below the actual printing resolution. Examples of organic electronic devices include OFETs, OLEDs, memory, sensing elements, solar cells, photo-sensors, photoreceptors for electrophotography and the like.

35 Claims, 14 Drawing Sheets

| U.S. PATENT DOCUMENTS | | | WO | 99/54786 | 10/1999 |

2002/0135039 A1   9/2002   Yang

FOREIGN PATENT DOCUMENTS

WO           82/03948        11/1982

OTHER PUBLICATIONS

Zschieschang U et al: "Organic Thin Film Transistors With Printed Gate Electrodes" 2002, Piscataway, NJ, USA, IEEE, USA, Jun. 26, 2002, pp. 191-195, XP0010594256.

ORGANIC ELECTRONIC DEVICES

This invention relates to organic electronic devices, to a process for their manufacture and to their uses, particularly but not exclusively to improved techniques that are especially suitable for the low cost fabrication of devices and circuits made from solution coatable organic materials by printing. Examples of organic electronic devices include organic field effect transistors (OFET), organic light emitting diodes (OLED), memory, sensing elements and the like. Such devices can be assembled into circuits, display devices, radio-frequency tags and the like.

Conventional electronic devices are based on inorganic semiconductors such as Si or GaAs. However, inorganic devices are often difficult and expensive to manufacture due to the high temperature processing conditions and the vacuum equipment required, particularly when fabricating large area devices e.g. display driver circuitry currently manufactured from amorphous or polycrystalline silicon.

Organic electronic devices offer the advantage of low temperature manufacturing on large areas, under ambient conditions and using flexible substrates. The possibility to use solution deposition techniques, especially printing, is very attractive. The term organic electronic device used herein means any electronic device having at least one layer which contains organic material, e.g. an organic semiconductor (OSC). Examples of organic electronic devices include OFETs and OLEDs.

Various techniques have been used for the fabrication of organic circuitry based on conjugated polymers. A recent review (S. Holdcroft in Advanced Materials, 2001, No23. p1753) describes these techniques. Techniques include conventional lithography; electron beam lithography; advanced techniques, such as scanning probe microscopy (SPM); direct photopatterning; photochemical patterning; photolithography; direct printing techniques, such as screen printing; micromoulding in capillaries (MIMIC); microcontact printing (or "soft lithography"); and non-impact printing techniques, such as ink-jet printing. Each of these techniques suffers one or more disadvantage.

Of the techniques above for patterning flexible organic circuits, photolithography offers the highest resolution, but, along with photochemical patterning, large area patterning is difficult to perform with good alignment and expensive particularly when specially made photomasks are required for each separate layer of a multilayer device. SPM is only feasible on very small substrates. Direct photopatterning, requires the complete conversion of an active material, for example, from a conductive to a nonconductive state, full conversion is difficult to achieve and reactive sites may remain.

Direct printing techniques can achieve resolutions of 100 µm, but they require accurate physical contact with the mask or screen to stop ink flowing onto unwanted areas. Further, the material to be printed has to be formulated into an ink with the right viscosity and wetting properties, this is difficult to achieve because many conjugated polymers which would otherwise be suitable for OFETs have undesirable rheological properties. MIMIC uses a mould for example of a preformed elastomer, such as a poly(dimethylsiloxane) (PMDS). This mould is placed on a substrate to be patterned and a liquid formulation is placed so that it can be drawn by capillary action into recessed channels of the mould. After curing or drying the ink the mould can be removed. OFET channels of 25 µm length can be fabricated by this technique, however, the patterned areas must be connected to each other via channels and it is difficult to prevent trapping bubbles within the fine features of a complex channel pattern. A further disadvantage is where several materials need to be patterned when it is difficult to align several layers accurately enough as the process is repeated. Microcontact printing relies on an active layer being formulated into an ink, and when used for the deposition of an etch mask, the layer to be patterned must be soluble or etchable. In non-impact printing techniques, such as ink-jet, it is not easy to formulate active materials of the circuit into an ink which can be ink-jetted, and direct deposition of the material leads to deposition of a non-uniform layer pattern.

A number of methods are disclosed in the literature for the manufacture of OLED displays. A recent review can be found in: C.R. Acad. Sci., Ser IV: Phys., Astrophys. (2000), 1(4), 493-508.

For manufacturing OLEDs from solution processable materials spin coating is routinely employed to give uniform thin films. The patterning of these devices can be achieved by forming a 3D-pixellated insulating structure (wells) on the injecting electrode by photolithography. However, deposition of solutions of electroluminescent materials in these wells can be problematic since the liquid tends to wet the walls of the well and this results in an uneven layer. Light emission and device efficiency of OLEDs is sensitive to this layer thickness, therefore photolithography is not entirely suitable for patterning OLED devices.

Screen-printing has been used to pattern either hole transport materials or emissive polymers in the manufacture of OLEDs. In each case a screen-printing fluid of an active material is prepared and patterned through a preformed mesh using a squeegee (Advanced Materials (2000), 12(17), 1249-1251). This method is not entirely suitable because problems are encountered in obtaining uniform film thickness, transfer of the mesh pattern and feature size resolution. Furthermore, the material to be patterned needs to be of the correct viscosity for screen printing, which is not always possible.

Ink-jet printing of OLED materials has been reported. For example, deposition of Nile Red doped into poly-vinylcarbazole onto a flexible substrate has been reported (Appl. Phys. Letts, 72(5) 519-521). However, uneven polymer distribution within the drops, domed topography of the drops, pin-holing and uneven light emission are reported problems.

The fabrication of OLED devices using the ink-jet deposition of an active material(s) (whether OLED, hole or electron transport material or conductive layer such as polyaniline (PANI) or poly(3,4-ethylenedioxy)thiophene-2,5-diyl (PEDOT) has been reported extensively. In all cases the active material is printed into a preformed pixellated substrate prepared by standard lithography (e.g. JP 10012377 (SEC); WO9907189 (Cambridge Consultants); WO9912397 (SEC); WO9939373 (Sturm)). Again, as with direct printing techniques generally, the materials need to be formulated into an active ink, which is not always possible.

Of the above techniques those which take advantage of liquid coatability of organic materials are much preferred. It is especially desirable that non-reactive techniques are used due to the sensitivity of OLED materials to the strong UV light or chemical photoinitiators used in photolithography. Printing techniques, e.g. inkjet, screen printing or soft lithography (Michel et al, IBM J. Res. & Dev., Vol 45, p697, 2001) hold much promise as the achievable resolution increases for example, by using novel ink-jet head and stamp materials. However, printing by these techniques requires the formulation of an active layer e.g. electroluminescent material into an effective ink. This can be problematic since the active materials are often only soluble in aggressive organic solvents or in acidic aqueous media. These can give rise to material compatibility issues either with the ink-jet head or with the stamp material. Accurate printing requires the adjustment of many parameters such as viscosity, levelling flow and drying properties of the formulation. This is not always easily achievable and soluble OLED materials are also sensitive to additives used in printing processes. Thus there is a need for improved techniques that still rely on printing, for example ink-jet, screen printing or microcontact printing, but resolve some of the issues of formulating OLED materials into inks.

Methods of "indirect" printing can solve the problem of formulating the materials into inks. EP0193820 (Kanegafuchi) describes such a method which includes forming a thin film pattern by forming a "lift-off layer" onto which the film to be patterned is deposited. The "lift-off layer" can be created by screen or ink jet printing. The method is described for use to pattern metal, silicide, amorphous or crystalline semiconductor and insulator. Possible applications include solar cells, photo sensors, photoreceptors for electrophotography, thin film diodes, and transistors. Examples provided are amorphous silicon solar cells. The invention does not teach or suggest the manufacture of OFET circuits nor OLEDs or displays. It discloses the patterning of vacuum deposited layers and does not relate to the patterning of solution coatable organic semi-conductor (OSC) materials. Furthermore and importantly, the method provided limits the achievable feature sizes to the resolution of the printing technique. Moreover, layer registration or alignment problems are not resolved by the technique.

WO 01/17041A1 (E-Ink) describes a technique for patterning where a semiconductor is affected locally by a "destructive agent". The destructive agent may be printed by inkjet, screen printing and the like, thus creating a patterned change in the semiconductor. This document also describes the use of a "release" layer to pattern an organic semiconductor layer. However, registration or alignment problems remain and the device features are limited by the printing resolution.

In summary, as indicated above, a number of approaches for direct or indirect printing of organic devices have been published. Direct printing techniques rely on formulating an electronically active material e.g. a semiconductor into a printing ink. Unfortunately, not all elements of organic devices are readily formulated into a printable ink. Accurate direct printing of an OSC requires the adjustment of many parameters such as viscosity, levelling, flow and drying properties of the formulation. This is not always easily achievable and soluble semiconductor materials are sensitive to additives used in printing processes. Thus there is a need for improved techniques that still rely on printing but resolve some of the issues of formulating OSC materials into inks. Some indirect methods resolve this problem, however, print resolution is still limited. There is a need to pattern layers of organic devices by ambient printing processes and a need for printing processes which resolve registration issues when one layer is printed above another and offer high resolution at low cost.

We have surprisingly discovered that using indirect patterning by printing there is a possibility to reduce device features below the actual print resolution. It is also possible to provide for very high degree of registration and alignment between layers despite the limited resolution of the actual print process. Using a printing process to achieve this is particularly advantageous for large area organic devices.

The present invention provides a method of forming an organic electronic device by printing. Advantageously, working features can be made smaller than the resolution of the printing method used. High accuracy self-alignment and registration is achieved between two or more layers by using a relatively low resolution printing technique.

According to the present invention, in a first aspect, there is a provided a method for forming an organic electronic device, which method comprises the steps of:
a) forming a negative image of a desired pattern on a substrate or layer of the device with a lift-off ink;
b) coating a first device layer to be patterned on top of the negative image;
c) coating one or more further device layers to be patterned on top of the first device layer to be patterned; and
d) removing the lift-off ink and unwanted portions of the device layers above it, thereby leaving the desired pattern of device layers.

According to the present invention, in another aspect, there is provided an organic electronic device obtainable by the method of the first aspect.

The method advantageously allows the formation of a device structure wherein the device layers to be patterned are self-aligned. The present invention enables a multiplicity of layers to be patterned in a single set of printing and lift-off steps using one pattern which ensures the excellent alignment of edges, which would be difficult to achieve by direct printing.

Examples of organic electronic devices include OFETs, OLEDs, memory, sensing elements, solar cells, photo-sensors, photoreceptors for electrophotography and the like.

Further advantages of the present method are that it:
provides a simple, cost effective way to manufacture organic electronic devices;
provides a simple, cost effective way of reducing feature sizes even with low resolution print techniques;
removes the need for formulating organic materials into inks;
avoids the need to use additives;
avoids registration problems by providing a highly accurate means of printing one layer on top of another; and
allows the creation of new multilayer structures
provides a means of obtaining good device layer thickness uniformity;
provides a way to print vertical field effect transistors;
provides a technique to pattern multicolour small molecule OLEDs; and
avoids formation of pre-defined wells used in prior art OLED manufacture.

These advantages are explained in more detail below.

The present method eliminates several problems encountered with the manufacture of organic electronic devices, for example, It is possible to overcome the issue of formulating OSC, insulator and conductor materials into inks as would be needed for direct printing. Thus, there is no need to compromise the materials by the use of additives or unwanted solvents. The ink can be chosen which is best suited to achieve high resolution and the same ink and printhead can be used for defining a variety of layers.

The deposition technique for the layer materials(s) may remain solution coating, but the choice of the techniques is wide because resolution is not now defined by this step.

The thickness uniformity of the final pattern is excellent, especially at the edges, which is particularly important for thin layers. This is difficult to achieve by direct printing. The use of lithographically patterned wells, with their inherent problems, may be avoided.

The method provides a means to achieve high accuracy of alignment between layers by simple and cheap printing techniques. The printed pattern can be used to affect lift-off of several layers at the same time. As a result, these layers will 'self align' in a highly effective manner. No direct printing technique has so far achieved such well-aligned overlay of vertical layers. There has been a previously unfulfilled need to print OLEDs and OFETs at high resolution, for example reducing gate to drain overlap which has not been solved in any printed OFET.

The use of self-alignment by the combination of print and lift-off makes it possible to achieve new OFET structures, such as vertical OFETs, as well as new OLED structures, e.g. multilayer OLEDs or red, green and blue pixels in good alignment, by low cost printing.

2. In one embodiment, the invention provides a method of patterning OFET circuits generally by relatively simple printing techniques ensuring that, if desired, all manufacturing steps may remain based on solution or liquid coating processes, which can be operated at under ambient conditions. The method can integrate the patterning of semiconductors, insulators, conductors and dopants for solution coated OFETs and integrated circuits using the same printing processes even if their direct patterning is difficult. The method can be fully ambient, and if required all manufacturing steps may remain based on solution coating. The OFET circuits may be used to manufacture electronic devices such as radio frequency tags, display drivers, oscillators, logic circuitry, sensor circuitry and the like. The invention provides a method of forming a vertical OFET. The invention also provides a method of forming an organic electronic device wherein the step d) forms one or more via (or interconnect) openings. The via openings may then be filled, for example by a conducting material.

In another embodiment, the method of the present invention can integrate the patterning of organic light emitting materials (polymer or small molecule), blocking layers, injection or transport layers, cathode and anode materials, display pixel interconnect layers and dopants for organics OLEDs and OLED displays. Again, the process can be fully ambient, and if required, all manufacturing steps can remain based on solution coating. The OLED devices may form part of an active or passive display matrix. The method can also be used as a complementary tool together with direct patterning techniques for OLEDs, such as those described in the art. The OLED elements may be used to manufacture multicolour displays, small or large area signs, logos or illuminating features.

The negative image of the desired pattern is preferably formed using a lift-off ink. The ink is printed onto the substrate or layer of the device. The term ink herein means a substance capable of being printed, rather than meaning that it must contain a colorant. The lift-off ink can be any substance which can be patterned and then removed by a lift-off step. The lift-off ink is preferably insoluble in the medium or media used to deposit the layers to be patterned. The lift-off ink medium is preferably a liquid which does not dissolve the substrate or layer on which the lift-off ink is printed. The lift-off ink medium can be either aqueous or non aqueous. For example, a water based lift-off ink is suitable on polymer surfaces that are insoluble in water, e.g. polyesters. An advantage is that the lift-off ink does not necessarily need to be electronic grade as it is removed in the process together with the layer to be patterned. The lift-off ink may be flexible in composition and include flow and other additives. When used with screen-printing applications, the lift-off ink can have a very high viscosity, up to 90,000 cp, preferably up to 70,000 cp, and more preferably between 500 and 10,000 cp. But when used with ink-jet printing, the ink viscosity is preferably in the range from about 0.7 to 100 cp, and more preferably from about 3 to 40 cp. The ink preferably has a surface tension from 20 to 70 dynes/cm, more preferably 20 to 60 dynes/cm. This will be governed both by the mode of printing, choice of inkjet printing head and the surface energy of the surface to be printed. Since good edge acuity is required then the surface tension of the lift-off ink relative to the substrate is preferably from 20 to 110 deg and more preferably 40 to 80 deg. For an inkjet lift-off ink the contact angle with the nozzle plate is preferably from 10 to 150 deg.

The lift-off ink may be in a liquid medium that may be polar or non-polar. The liquid medium preferably has a boiling point in the range from 40° C. to 300° C. Preferred liquid media include, but are not limited to, water; alcohols such as methanol and ethanol; dioxane, aromatic hydrocarbons such as toluene and xylene; haloalkanes such as chloroform and 1,2-dichloroethane; ethers such as tetrahydrofuran, haloarenes such as dichlorobenzene; glycols, and cyclic amides. The lift-off ink preferably contains from 50% to 99.8% liquid medium, by weight. Liquid medium mixtures are preferred to help control ink application properties such as latency, substrate wetting and drying time.

The lift-off ink may further comprise a colorant, a polymeric binder and functional additives, which are used to modify the ink viscosity, surface tension and latency. Suitable colorants for the lift off composition include dyes or pigments, such as carbon black. Suitable polymeric binders for the lift-off ink include, but are not limited to, acrylics, polyurethanes or silanes.

Cross-linking agents can be included in the lift-off ink to permit cross-linking of the printed ink. This modifies the lift-off parameters either through partial shrinkage to aid lift-off or to improve resistance to the subsequent coating solution. Cross-linking agents are preferably added to the ink in a concentration in a range from 0.5 to 30 wt. % of the solid ingredients, and more preferably from 1 to 10 wt. % of the solid ingredients. Partial shrinkage or micro-cracks may be induced, for example, by heat or light curing. This way the efficiency of the lift-off step may be improved by allowing the lift-off medium to penetrate the ink at the pattern edges or through its surface.

The wetting of the ink formulation may be optimised by the surface treatment of the substrate, for example, by plasma treatment. Such treatment may also be used to enhance adhesion of the layer to be patterned to the substrate or improve edge acuity. As a result, the lift-off of the lift-off ink together with the layer above may be more efficient. The technique can be further optimised by using intermediate layers coated between the ink pattern and the layer to be patterned. Such layers can be used as barriers stopping the diffusion of ink into other layers.

The lift-off ink may be deposited on the substrate or layer of the device by a direct printing technique. Suitable direct printing techniques include ink-jet printing, screen printing, microcontact printing, stamping, soft lithography or electrophotographic printing using a liquid or solid toner. Ink-jet printing is particularly preferred. The term ink thus includes toner. In each case the ink is formulated to the appropriate viscosity, rheology and surface tension for the specific printing process. The use of ink-jet printing is advantageous because the same ink formulation and ink-jet head may be used, followed by the same chemical or mechanical process for the lift-off step, for the patterning of different layers thereby simplifying the hardware required. The printed lift-off ink is preferably thicker than the layer subsequently deposited onto it, this improves the efficiency of the lift-off step. The lift-off pattern is preferably from 100 nm to 100 µm thick, more preferably from 1 µm to 50 µm.

The ink may optionally be used in one or more additional steps as an etch mask.

The device layers to be patterned may each independently be applied by a variety of coating and printing techniques. Examples include spin-, spray-, dip-, web-, die- or evaporation coating; electroless deposition and ink-jet printing, screen printing, microcontact printing, stamping or soft lithography. When OLED layers to be patterned are deposited by ink-jet printing, selective deposition on different areas is possible. For example, red, green and blue electroluminescent materials may be deposited on different areas. When OFET layers to be patterned are deposited by ink-jet printing, selective deposition on different areas is possible. For example, n or p type organic materials may be deposited on different areas. Subsequently the pattern is defined by the underlying lift-off ink, offering better resolution since more than one material is patterned by the same lift-off layer deposited in a single printing step.

The thickness of the device layer or multiplicity of layers may be from 1 nm (in case of a monolayer) to 10 µm, preferably from 1 nm to 1 µm, more preferably from 1 nm to 500 nm. The preferred deposition technique for the device layers to be patterned is a liquid coating technique, more preferably spin-, die- or spray-coating.

Once the lift-off ink is printed and the device layers to be patterned are deposited above it, the step of lift-off can be carried out by dissolving the lift-off ink using a liquid medium. During this step the lift-off pattern is removed together with parts of the device layers to be patterned. Any liquid medium may be employed for this, as long as it dissolves little or none of the device layers to be patterned which are on the substrate, or in multilayer devices on an earlier patterned layer. Preferred liquid media include water, alcohols such as methanol and ethanol. Liquid media may be used alone or in combination with other liquid media. The efficiency of the lift-off part of the process may be enhanced by ultrasonic agitation, stirring, spraying liquid medium and/or heating. The lift-off part of the process may be optionally effected by abrasion, high pressure air or other mechanical action.

Various substrates may be used for the fabrication of organic electronic devices, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetra-fluoroethylene, fibre glass enhanced plastic, fluorocarbon polymers, hexafluoropropylenevinylidenefluoride copolymer, high density poly-ethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones. Preferred substrate materials are polyethyleneterephthalate, polyimide, and polyethylenenapthalate. The substrate may be any plastic material, metal or glass coated with the above materials. The substrate should preferably be homogenous to ensure good pattern definition. The substrate may also be uniformly pre-aligned by extruding, stretching, rubbing or by photochemical techniques to induce the orientation of the organic semiconductor in order to enhance carrier mobility.

Application of the invention in the manufacture of OFETs is now described in more detail.

Device layers in the case of OFETs (also referred to as OFET layers) may be independently selected from a conductor, a dopant, an insulator or an OSC.

Where the OFET layer is a conductor it may be inorganic or organic or a composite of the two. The conductor may provide an electrode for an OFET or provide an interconnect between the OFET and other elements. The conductor may also act as part of a passive circuit element in an OFET circuit, for example a capacitor, conductor or antenna for a radio frequency tag (RF-tag). Conductors that are deposited by liquid coating to enable ambient processing are preferred. Examples are polyaniline, polypyrrole, PEDOT or doped conjugated polymer. Further examples are dispersions or pastes of graphite or particles of metal such as Au, Ag, Cu, Al, Ni or their mixtures. Organometallic precursors may also be used deposited from a liquid phase. Conductors are preferably spray-, dip-, web- or spin-coated or deposited by any liquid coating technique. Any liquid medium may be employed as long as it does not dissolve the lift-off ink. If required, conductive layers may be deposited from vapour phase.

Combining printing with a lift-off process a true high conductivity metal layer can be patterned by printing into an OFET. Metal OFET electrodes have previously been patterned only by lithography or shadow mask evaporation. OFETs are useful for radio frequency tag circuits, which require a high conductivity antenna. The fabrication of the antenna is particularly problematic as the polyaniline (PANI) or poly(3,4-ethylenedioxy)thiophene-2,5-diyl (PEDOT) tracks used for printed OFETs are sufficiently conductive for source, drain and gate electrodes but not conductive enough for an efficient antenna. The present approach allows the manufacture of devices where patterning is carried out by printing for both soluble and insoluble components using the same process.

When a p-channel OFET is doped to increase the hole density in a certain region of the device, acceptor-like compounds may be used as dopants. A suitable dopant may be any acceptor-like compound, e.g. tetracyanoethylene; 3-nitrobiphenyl; 2,6-dimethyl-p-benzoquinone; 2,3,5,6-tetrafluoro-p-benzoquinone (TFBQ); 2,3,5,6-tetrachloro-p-benzoquinone (TCBQ); o-chloranil; p-chloranil; 2,4,7-trinitrofluorenone; pyromellitic dianhydride; fullerenes; 1(benzamido)-4-nitronaphthalene; tetracyanoquinodimethane (TCNQ); 2,3,5,6-tetrafluoro-7,7,8,8-tetracyanoquinodimethane (4FTCNQ); diphenoquinones; bathophenanthrolines; and organic acids. Since n-type organic semiconductors are typically acceptor-like in character, the dopant may be an n-type OSC. Dopants are preferably organic and preferred dopants are TCNQ, 4FTCNQ and diphenoquinones.

When an n-channel OFET is doped to increase the electron density in a certain region of the device, suitable dopants are donor-like. Any donor-like compounds can be used, e.g. dibenzothiophene, phenothiazine, tetramethyl-p-phenylenediamine bis(ethylene-dithio)-tetrathiafulvalene. The dopant may also be a p-type OSC material, i.e. one which due to its donor character forms a complex with the n-type OSC. Organic bases may also be used.

Where the OFET layer is an insulator it may be inorganic or organic or a composite of the two. It is preferred that the insulator is solution coated which allows ambient processing. When the insulator is being patterned, it may perform the function of interlayer insulation or act as gate insulator for an OFET. The insulator may be any organic polymer or polymer precursor, optionally containing inorganic particles. The insulator can be spray-, dip-, web- or spin coated or deposited by any liquid coating technique. Any liquid medium may be employed as long as it does not dissolve the lift-off ink. Preferred gate insulators are those that provide a low permittivity interface to the semiconductor. This can be achieved by a single or multilayer insulator structure as described in our co-pending patent application PCT/GB01/05145.

Where the OFET layer is an OSC, it may be an n- or p-type OSC, which can be deposited by vacuum or vapour deposition, or from solution and is preferably deposited from a solution. Preferred OSCs have a FET mobility of greater than $10^{-5}$ cm$^2$V$^{-1}$s$^{-1}$.

The OSC is used as the active channel material in an OFET or a layer element of an organic rectifying diode. OSCs that are deposited by liquid coating to allow ambient processing are preferred. OSCs are preferably spray-, dip-, web- or spin-coated or deposited by any liquid coating technique. Ink-jet deposition is also suitable. Any liquid medium may be employed as long as it does not dissolve the lift-off ink when the OSC is patterned. The OSC may optionally be vapour deposited.

The OSC may be any conjugated aromatic molecule containing at least three aromatic rings. The OSCs preferably contain 5, 6 or 7 membered aromatic rings, and more preferably contain 5 or 6 membered aromatic rings.

Each of the aromatic rings may optionally contain one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N(R$^3$)(R$^4$), where R$^3$ and R$^4$ each independently is H, optionally substituted alkyl, optionally substituted aryl, alkoxy or polyalkoxy groups. Where R$^3$ and R$^4$ is alkyl or aryl these may be optionally fluorinated.

The rings may be optionally fused or may be linked with a conjugated linking group such as —C(T$_1$)=C(T$_2$)—, —C≡C—, —N(R')—, —N=N—, (R')=N—, —N=C(R')—. T$_1$ and T$_2$ each independently represent H, Cl, F, —C≡N or lower alkyl groups particularly C$_{1-4}$ alkyl groups; R' represents H, optionally substituted alkyl or optionally substituted aryl. Where R' is alkyl or aryl these may be optionally fluorinated.

Other OSC materials that can be used in this invention include compounds, oligomers and derivatives of compounds of the following:

conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene; oligomeric para substituted phenylenes such as p-quaterphenyl (p-4P), p-quinquephenyl (p-5P), p-sexiphenyl (p-6P); conjugated heterocyclic polymers such as poly(3-substituted thiophene), poly(3,4-bisubstituted thiophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; C$_{60}$ and C$_{70}$ fullerenes; N,N'-dialkyl, substituted dialkyl, diaryl or substituted diaryl-1,4,5,8-naphthalenetetracarboxylic diimide and fluoro derivatives; N,N-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Preferred compounds are those from the above list and derivatives thereof which are soluble.

A preferred class of OSCs has repeat units of Formula 1:

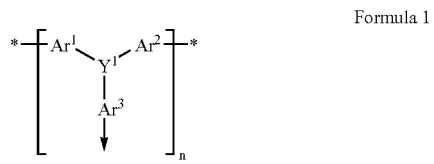

Formula 1 where each Y$^1$ is independently selected from P, S, As, N and Se$_2$ and preferably polyarylamines, where Y$^1$ is N; Ar$^1$ and Ar$^2$ are aromatic groups and Ar$^3$ is present only if Y$^1$ is N, P, or As in which case it too is an aromatic group. Ar$^1$, Ar$^2$ and Ar$^3$ may be the same or different and represent, independently if in different repeat units, a multivalent (preferably bivalent) aromatic group (preferably mononuclear but optionally polynuclear) optionally substituted by at least one optionally substituted C$_{1-40}$ carbyl-derived groups and/or at least one other optional substituent, and Ar$^3$ represents, independently if in different repeat units, a mono or multivalent (preferably bivalent) aromatic group (preferably mononuclear but optionally polynuclear) optionally substituted by at least one: optionally substituted C$_{1-40}$ carbyl-derived group and/or at least one other optional substituent; where at least one terminal group is attached in the polymer to the Ar$^1$, Ar$^2$ and optionally Ar$^3$ groups located at the end of the polymer chains, so as to cap the polymer chains and prevent further polymer growth, and at least one terminal group is derived from at least one end capping reagent used in the polymerisation to form said polymeric material to control the molecular weight thereof.

WO 99/32537 and WO 00/78843 describe certain novel oligomers and polymers, which have repeat units of Formula 1. The disclosures in these applications, particularly the novel oligomers and polymers are incorporated herein by reference, as these materials are particularly useful as OSCs in the present invention.

The number average degree of polymerisation is denoted by n and the number of the repeat units of Formula 1 which may be present per molecule in the invention may be from 2 to 1,000, preferably from 3 to 100 and more preferably from 3 to 20. The polymer may comprise a mixture of different polymeric species of varying chain lengths and with a distribution of molecular weights (polydisperse) or consist of molecules of a single molecular weight (monodisperse).

The preferred polymeric materials are obtainable by polymerisation controlled by the addition of at least one end capping reagent in an amount sufficient to reduce substantially further growth of the polymer chain.

The asterisks extending from Ar¹ and Ar² in Formula 1 are intended to indicate that these groups may be multivalent (including divalent as shown in Formula 1).

The invention also includes polymers further substituted with, on average, more than one aryl moiety which is further substituted with a moiety capable of chain extension or cross linking, for example by photopolymerisation or by thermal polymerisation. Such moieties capable of chain extension are preferably hydroxy, glycidyl ether, acrylate ester, epoxide, methacrylate ester, ethenyl, ethynyl, vinylbenzyloxy, maleimide, nadimide, trifluorovinyl ether, a cyclobutene bound to adjacent carbons on an aryl moiety or a trialkylsiloxy.

Other amine materials that may be useful in this invention are tetrakis(N,N'-aryl)biaryldiamines, bis(N,N'-[substituted] phenyl), bis(N,N'-phenyl)-1,1'-biphenyl-4,4'-diamines including 4-methyl, 2,4-dimethyl and/or 3-methyl derivatives thereof, tetrakis(N,N'-aryl)biphenyl-4,4'diamine-1,1-cyclohexanes and their derivatives, triphenylamine and its alkyl and aryl derivatives and poly(N-phenyl-1,4-phenyleneamine), N-dibenzo[a,d]cycloheptene-5-ylidene-N',N'-di-p-tolyl-benzene-1,4-diamine, (9,9-dimethyl-9H-fluorene-2-yl)-di-p-tolyl-amine and their derivatives.

Further polyarylamine materials which may be useful in this invention have the following formulae:

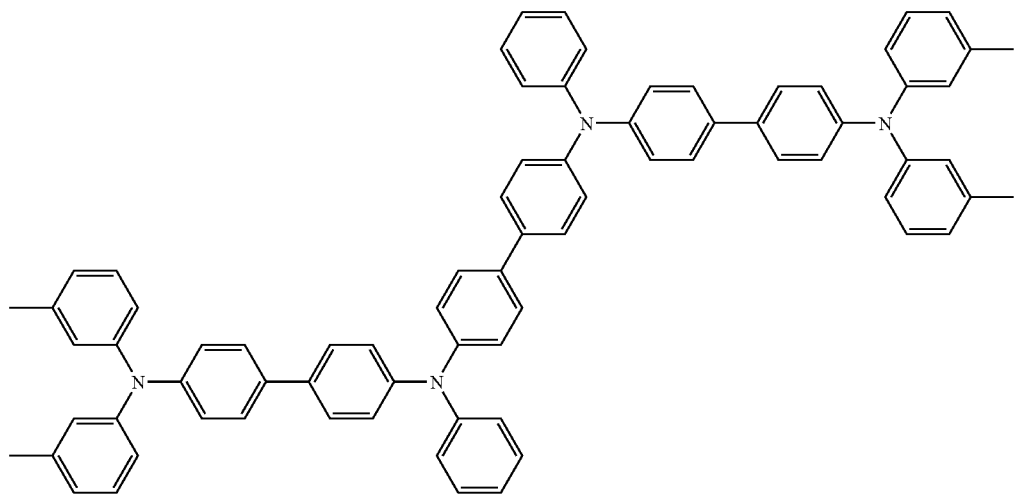

TPTE

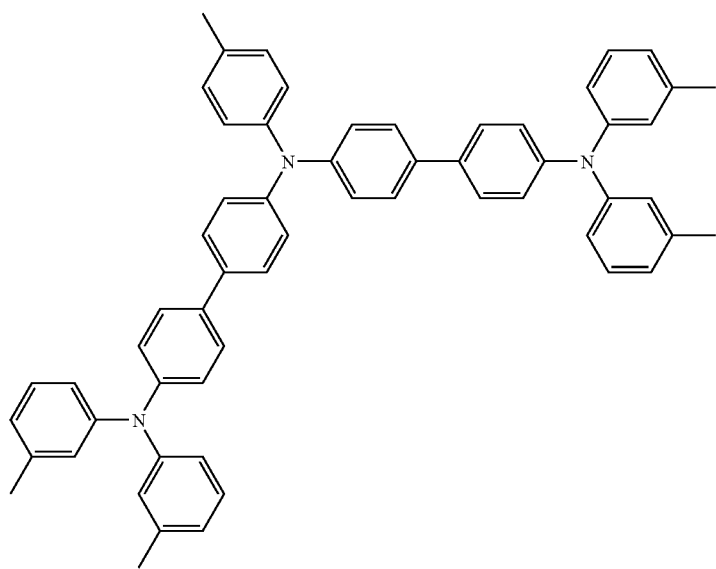

TPTR

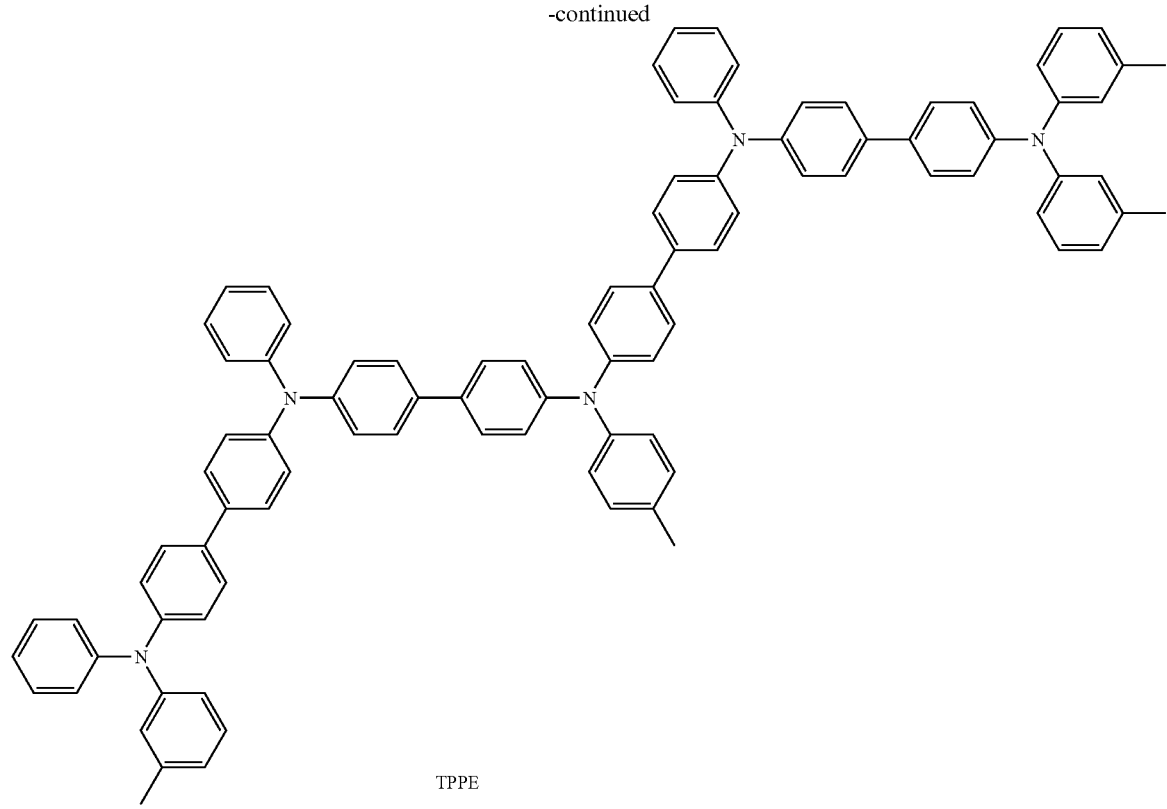
TPPE
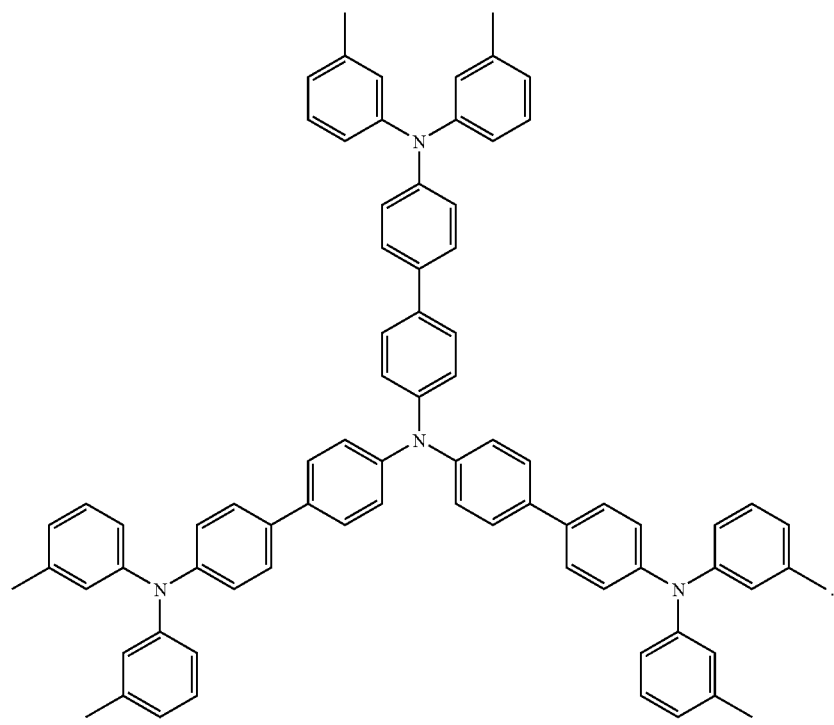
TPTE(S)

These molecules are prepared directly via a multi-stage chemical synthesis which produces each molecule in a chemically pure monodisperse form.

Related materials, which may also find use in this invention have also been described in patent DE 3610649, EP 0669654-A (=U.S. Pat. No. 5,681,664), EP 0765106-A, WO 97-33193, WO 98-06773, U.S. Pat. No. 5,677,096 and U.S. Pat. No. 5,279,916.

Conjugated oligomeric and polymeric heterocyclic semiconductors may comprise a repeat unit of an optionally substituted 5 membered ring and terminal groups $A^1$ and $A^2$ as shown in Formula 2:

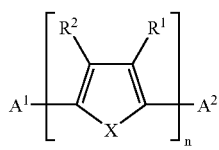

Formula 2 in which X may be Se, Te or preferably O, S, or —N(R)— where R represents H, optionally substituted alkyl or optionally substituted aryl; $R^1$, $R^2$, $A^1$ and $A^2$ each independently may be H, alkyl, alkoxy, thioalkyl, acyl, aryl or substituted aryl, fluoro, cyano, nitro or an optionally substituted secondary or tertiary alkylamine or arylamine represented by —N($R^3$)($R^4$), where $R^3$ and $R^4$ are as defined above. The alkyl and aryl groups represented by $R^1$, $R^2$, $R^3$, $R^4$, $A^1$ and $A^2$ may be optionally fluorinated. The number of recurring units in the conjugated oligomer of Formula 2 is represented by an integer n, where n is preferably from 2 to 14. Preferred oligomers have X=S, $R^1$ and $R^2$=H. and $A^1$ and $A^2$=optionally substituted $C_{1-12}$ alkyl groups, examples of especially preferred compounds are those in which $A^1$ and $A^2$=n-hexyl and where n=4, alpha-omega-n-hexylquaterthienylene (alpha-omega 4T), n=5, alpha-omega-n-hexylpentathienylene (alpha-omega-5T), n=6, alpha-omega-n-hexylhexathienylene (alpha-omega-6T), n=7, alpha-omega-n-hexylheptathienylene (alpha-omega-7T), n=8, alpha-omega-n-hexyloctathienylene (alpha-omega-8T), and n=9, alpha-omega-n-hexylnonathienylene (alpha-omega-9T).

Oligomers containing a conjugated linking group may be represented by Formula 3:

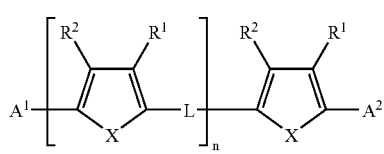

Formula 3 in which X may be Se, Te, or preferably O, S, or —N(R)—, R is as defined above; $R^1$, $R^2$, $A^1$ and $A^2$ as defined above for Formula 2. Linking group L represents —C($T_1$)=C($T_2$)—, —C≡C—, —N(R')—, —N=N—, (R')=N—, —N=C (R')— with $T_1$ and $T_2$ defined as above.

Polymers may have repeat units of the general Formula 4:

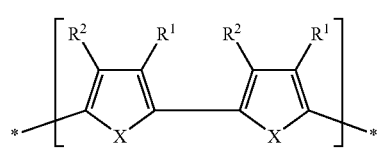

Formula 4 in which X, $R^1$ and $R^2$ are defined as above. The sub units may be polymerised in such a way as to give a regio regular or a regio random polymer comprising repeat units as shown in Formulae 4 to 6:

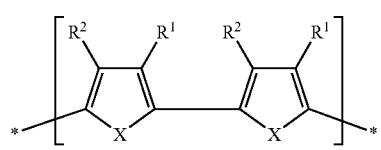

Formula 4

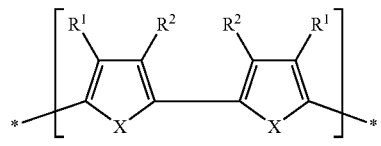

Formula 5

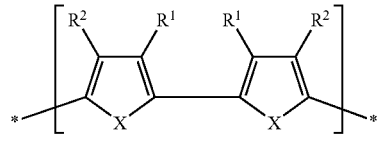

Formula 6

Polymers may have repeat units of the general Formula 7:

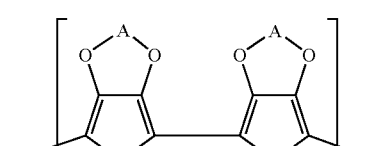

Formula 7 in which X is as defined above and the bridging group A is optionally fluorinated $C_{1-6}$ alkyl, for example poly(3,4-ethylenedioxy)thiophene-2,5-diyl and poly(3,4-trimethyldioxy) thiophene-2,5-diyl.

Polymers may have repeat units of general Formula 8:

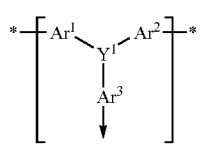

Formula 8 in which X, $R^1$ and $R^2$ are defined as above. Preferably one of $R^1$ or $R^2$ is an alkoxide of general formula $C_nH_{2n+1}O$— in which n is from 1 to 20, and the other of $R^1$ or $R^2$ is H, poly(dodecyloxy-α,α',-α,α" terthienyl) i.e. polyDOT$_3$.

Polymers may have repeat units of general Formula 9:

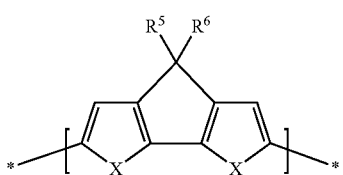

Formula 9 in which X is as defined above; $R^5$ and $R^6$ each independently is H, alkyl or substituted alkyl, aryl or substituted aryl. The alkyl and aryl groups may be optionally fluorinated.

Polymers may have repeat units of general Formula 10:

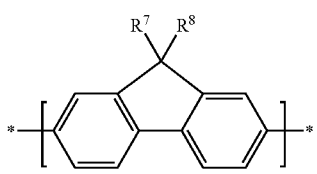

Formula 10 in which $R^7$ and $R^8$ each independently is optionally substituted $C_{1-20}$-hydrocarbyl, $C_{4-16}$-hydrocarbyl carbonyloxy, $C_{4-16}$ aryl(trialkylsiloxy) or both $R^7$ and $R^8$ may form with the 9-carbon on the fluorene ring a $C_{5-20}$ ring structure or a $C_{4-20}$ ring structure containing one or more heteroatoms selected from S, N or O.

Polymers may have repeat units of general Formula 11:

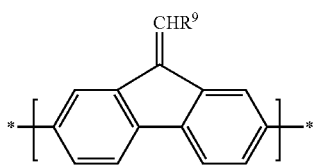

Formula 11 wherein $R^9$ is $C_{1-20}$ hydrocarbyl optionally substituted with di($C_{1-20}$ alkyl)amino, $C_{1-20}$ hydrocarbyloxy or $C_{1-20}$ hydrocarbyl or tri($C_{1-10}$alkyl)siloxy.

Copolymers comprising repeat units as described above and other repeat units comprising two or more of the repeat units could be used. Copolymers preferably comprise one or more repeat units of Formula 10 or Formula 11 and Formula 1. In a further preference copolymers comprise one or more repeat units of Formula 1 and one or more repeat units of at least one of Formulae 2 to 9.

In co-pending patent application PCT/GB01/05145 we describe OFETs made using solution coated compositions of an organic semiconductor and a binder polymer. The semiconductor compositions in that document are also incorporated herein for use in the present invention.

Where the semiconductor is a p type semiconductor this is preferably a polydisperse polyarylamine, mixtures of monodisperse polyarylamines, fluoro arylamine co-polymers, or cross-linkable arylamines.

Where the semiconductor is an n type semiconductor this is preferably a fluorophthalocyanine, or a substituted diaryl-1,4,5,8-naphthalenetetracarboxylic diimide and its oligomers.

The semiconducting channel may also be a composite of two or more of the same types of semiconductors. Furthermore, a p type channel material may, for example be mixed with n-type materials for the effect of doping the layer. Multilayer semiconductor layers may also be used. For example the semiconductor may be intrinsic near the insulator interface and a highly doped region can additionally be coated next to the intrinsic layer. The invention provides the means to pattern multilayers of semiconductors in a single step with good edge accuracy. It also provides the means to pattern locally doped regions in an OFET circuit.

Application of the invention in the manufacture of OLEDs is now described in more detail.

The OLED comprises at least an anode (electron blocking layer or hole injection electrode), a cathode (hole blocking layer or electron injection electrode) and an electroluminiscent layer. The OLED optionally comprises other layers such as an a hole injection layer(s), a hole transport layer(s), an electron injection layer(s), an electron transport layer(s), a dopant, an insulator(s), a conductor or interconnect. All or any of the aforementioned layers constitute device layers as referred to herein which can be patterned according to the present invention.

The electroluminescent layer is made up of substantially organic or organometallic electroluminescent materials. Suitable materials include organic photo- or electroluminescent, fluorescent and phosphorescent compounds of low or high molecular weight. Suitable low molecular weight compounds include, but are not limited to, substituted 9,9' spirobifluorenes (EP 0676461), Alq3 (an aluminum complex formed by coordination of three molecules of hydroxyquinoline with an aluminum atom), lanthanide complexes such as those of europium and ytterbium (WO 9858037), triplet emitters such as Ir[2-PhPy]$_3$. Suitable high molecular weight materials include polymers preferably those having substantially conjugated backbone (main chain), such as polythiophenes, polyphenylenes, polythiophenevinylenes, polyphenylenevinylenes, polyalkylfluorenes. In the present invention the term polymer includes homopolymer, copolymer, terpolymer and higher homologous as well as oligomers. Examples of such mateials are given in U.S. Pat. No. 5,708,130, WO97/39082, WO96/10598.

The electroluminescent layer preferably has an average thickness of from 50 to 200 nm, more preferably from 60 nm to 150 nm.

The electron blocking layer (hole injection electrode) is suitably made of a metal or an alloy having a high work function such as Au, Pt, Ag. Preferably, a more transparent electron blocking layer (hole injection electrode) material such as an indium tin oxide (ITO) is used. Conductive polymers such as polyaniline (PANI) and a poly-3,4-ethylenedioxythiophene (PEDOT) are also suitable transparent hole-injection electrodes. Preferably, the electron blocking layer (hole injection electrode) has a thickness of from 50 to 300 nm.

Hole-injecting and hole-transporting layer materials include soluble phthalocyanine compounds, triarylamine compounds, electroconductive polymers, perylene compounds, and europium complexes.

Electron-injecting and electron-transporting layer materials include Alq3, azomethine zinc complexes, and distyrylbiphenyl derivatives. These are however not exhaustive.

The electron injection electrode is preferably made of a metal or an alloy having a low work function, such as Yb, Ca, Al, Mg:Ag, Li:Al, Ba or is a laminate of different layers such as Ba/Al or Ba/Ag electrode.

Dopants may be compounds such as 3-(2-Benzothiazolyl)-7-diethylaminocoumarin (Coumarin 6), europium complexes, ruthenium complexes, Rhodamine salts, platinum complexes, iridium complexes and Nile red although this list is not exhaustive.

Insulators used in the invention for OLEDs may be inorganic or organic or a composite of the two. It is preferred that the insulator is solution coated enabling ambient processing. When the insulator is being patterned, it may perform the function of a blocking layer between OLED materials. The insulator may be any organic polymer or polymer precursor, optionally containing inorganic particles. The insulator can be spray-, dip-, web- or spin coated or deposited by any liquid coating technique. Any liquid carrier may be employed as long as it does not dissolve the liftoff ink.

Specifically, the invention also provides methods of forming an OFET and an OLED respectively.

The invention will now be described, by way of example only, with reference to the accompanying drawings in which:

FIG. 1a) shows a profile of material printed directly on a flat substrate;

FIG. 1b) shows the profile of material printed into a pre-patterned well on a flat substrate;

In the present invention indirect patterning is utilised to achieve self-aligned structures.

Figure 1:
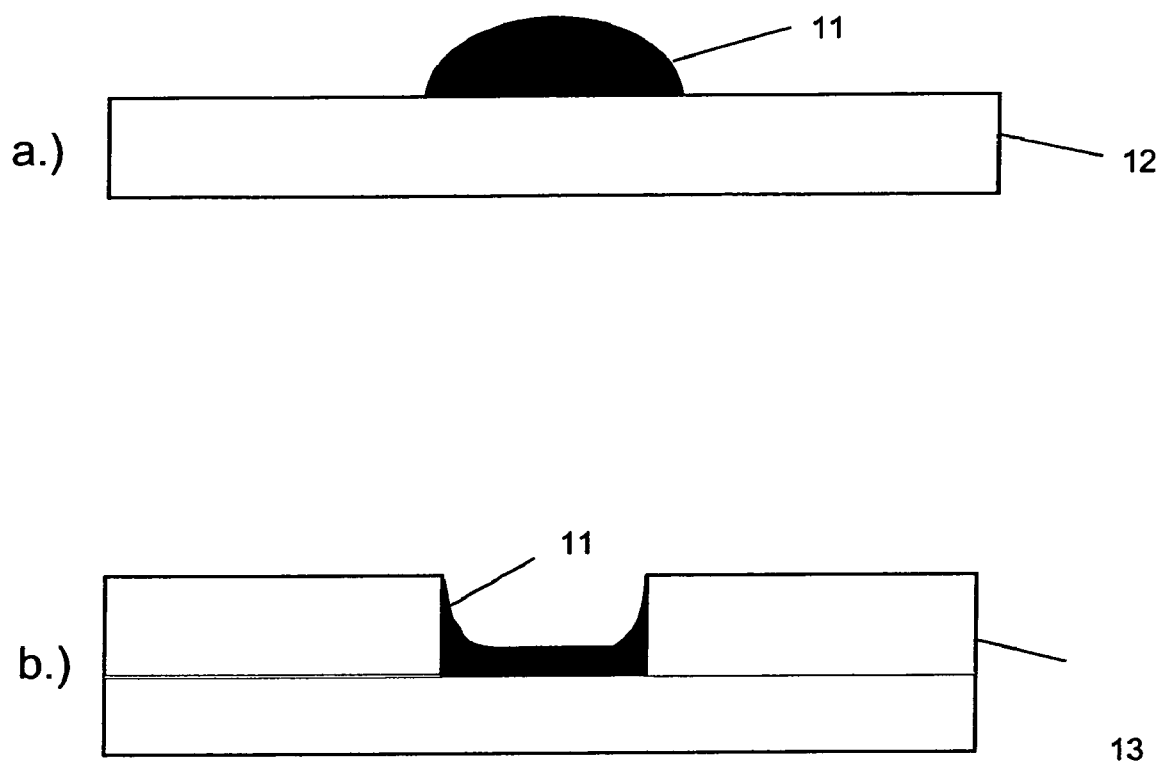

As FIG. 1 illustrates, direct printing often results in layers that are not uniform in thickness whether the material to be patterned 11 is printed on a flat substrate 12 or into a predefined well 13.

Figure 2:
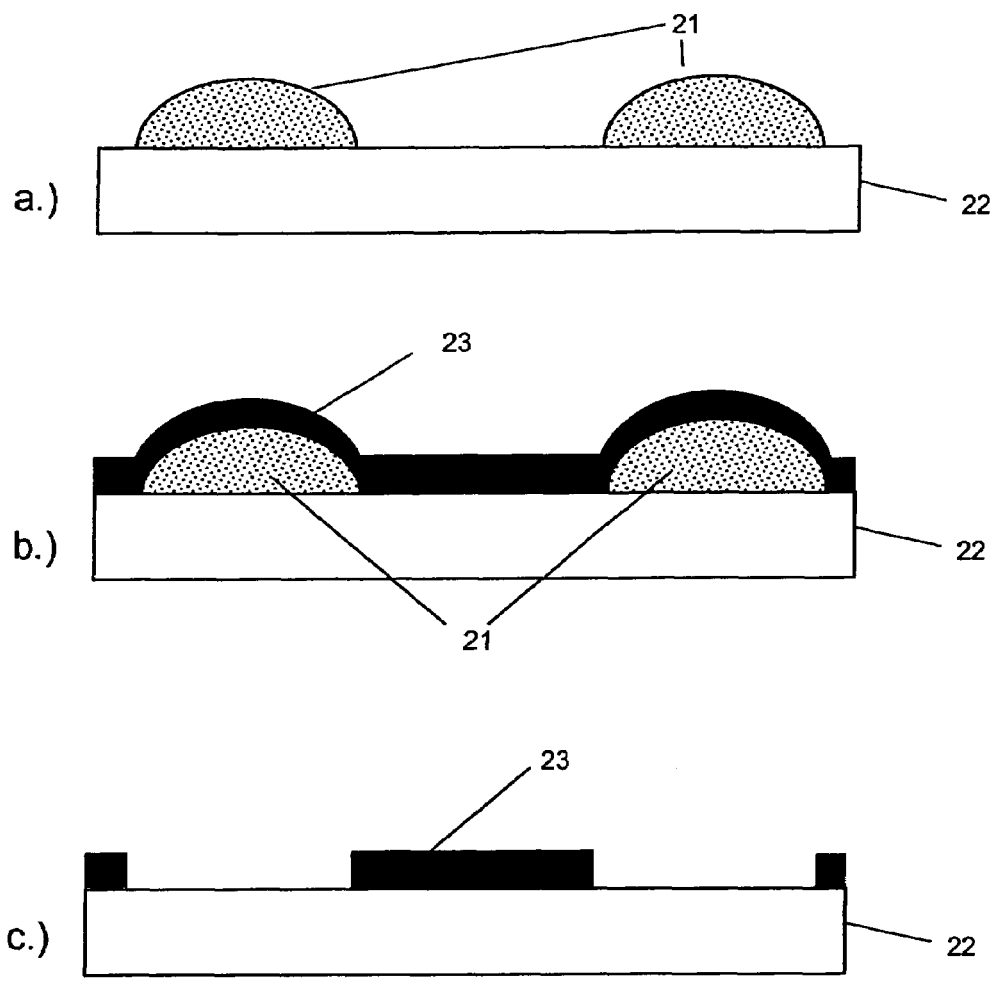
FIG. 2 shows benefits of indirect printing to create a uniform pattern in the plane of the substrate.

In an indirect process, a negative pattern is printed with a separate, specially selected ink 21 (i.e. the lift-off ink) as shown in FIG. 2. The layer to be patterned 23 can be deposited over the whole area of the substrate 22. Areas of the layer 23 are then removed together with the print pattern 21. One advantage of this is that the layer material 23 (e.g. organic semiconductor) does not have to be formulated into a printing ink. There is a much higher degree of freedom in designing and formulating an inert ink 21, since additives can be used and the viscosity and flow properties are easier to control. A further advantage of an indirect process is that good uniformity and edge definition of layer 23 is achieved as shown in FIG. 2c. This is significantly better than that shown in FIG. 1, layer 11. The profile of the deposited material 11 will normally be thinner at its edges when deposited on a flat substrate 12 as shown in FIG. 1a, or a prepatterned well 13 as shown in FIG. 1b.

Figure 3:
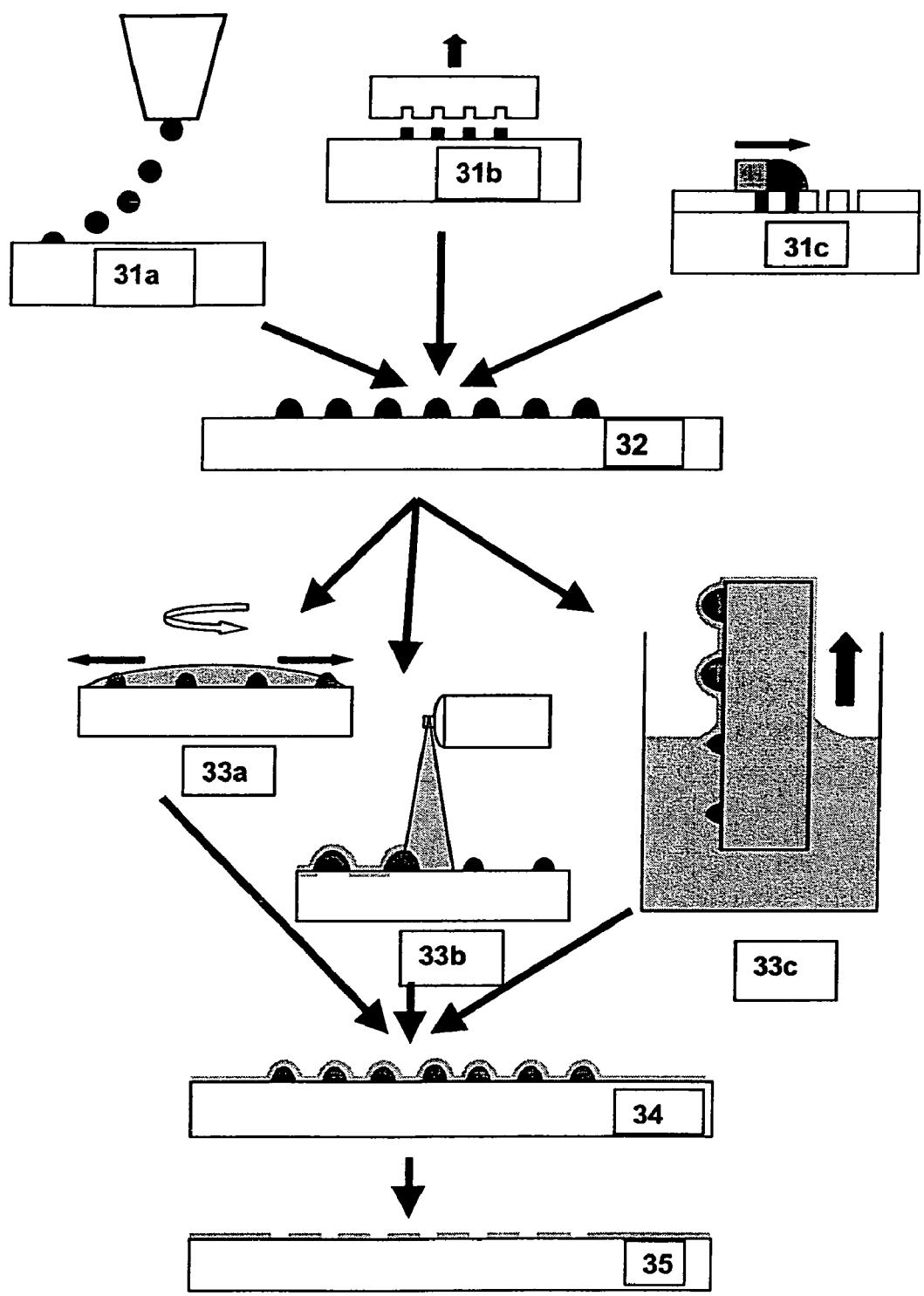
FIG. 3 shows indirect printing by ink-jet, stamping and microcontact printing.

The ink pattern may, for example be applied by ink-jet, stamping or microcontact printing as illustrated in FIG. 3 by 31a, 31b, 31c. The material to be patterned is then coated onto this layer uniformly by spin-(33a), spray-(33b), dip-(33c), web coating, evaporation or ink-jet printing. Subsequently the ink and the unwanted material can be removed using a lift-off process. Unfortunately the feature size is limited to the resolution of the print technique used, which is not always satisfactory.

However, with the present invention, it is possible to obtain devices with dimensions of the active area (e.g. FET channel length) smaller than the print resolution by certain processes using indirect printing. It is also possible to manufacture improved devices with excellent alignment between layers despite using low resolution print techniques.

Figure 4:
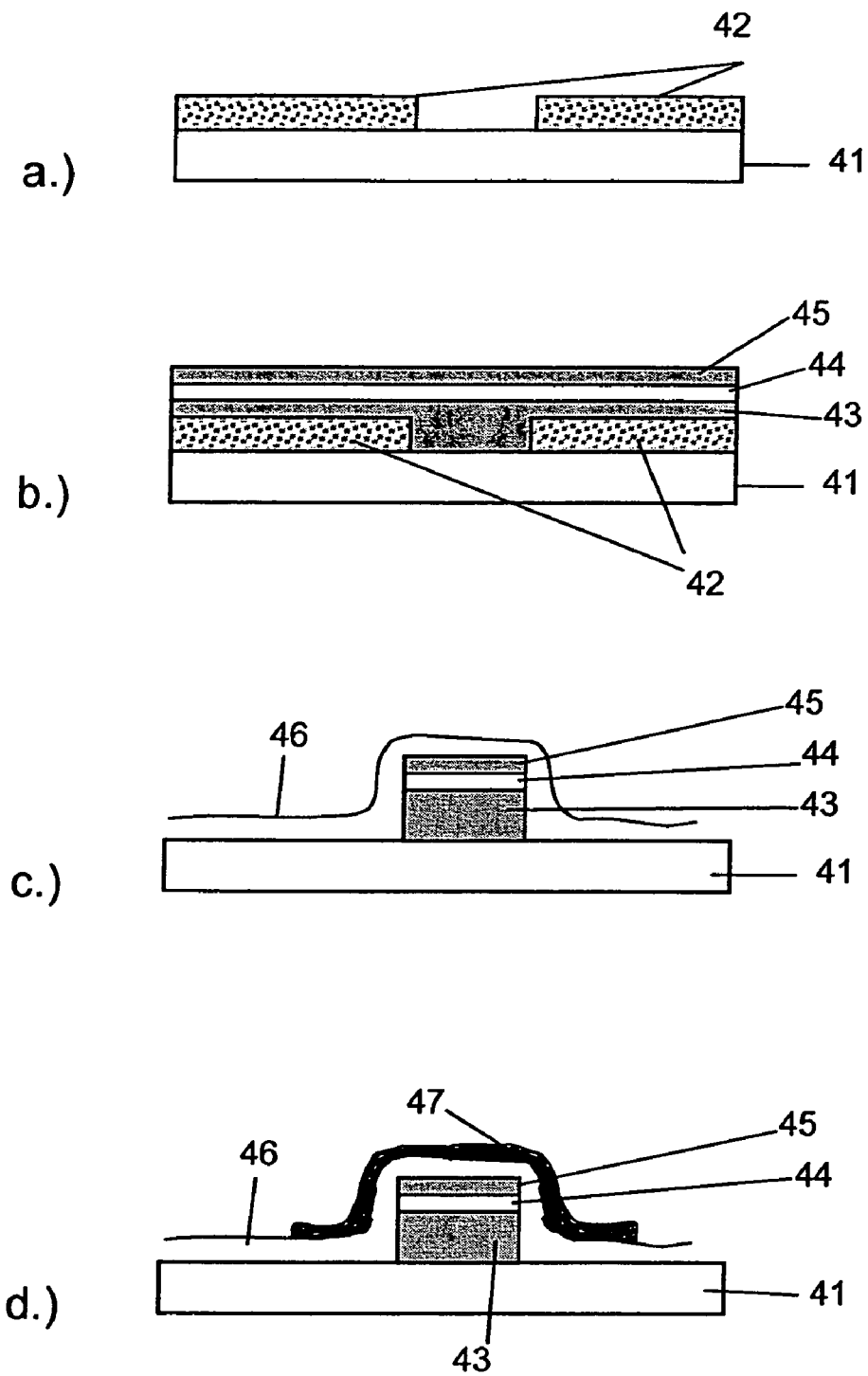
FIG. 4 shows an example of a vertical OFET device by indirect printing and self-alignment.

In one embodiment, a layer printed at low resolution is used to create a vertical transistor by a process shown in FIG. 4. Here, an inert, lift-off, ink pattern 42 is printed on substrate 41. Onto this pattern a conductor layer 43, a semiconductor layer 44 and a second conductor layer 45 are deposited. Following removal of the ink pattern 42 together with portions of the layers above, a vertically aligned pair of electrodes 43 and 45 are formed with the semiconductor between them as shown in FIG. 4c. This structure is then coated with an insulator layer 46, preferably from the liquid phase. Finally a gate electrode 47 is patterned using any of the aforementioned techniques. In this embodiment, an OFET may be created by ink-jet printing with source and drain electrodes separated by a very small distance set by the thickness of the semiconductor layer 44. Such short OFET channels would otherwise be difficult to print with direct ink-jet printing described in the prior art.

Figure 5:
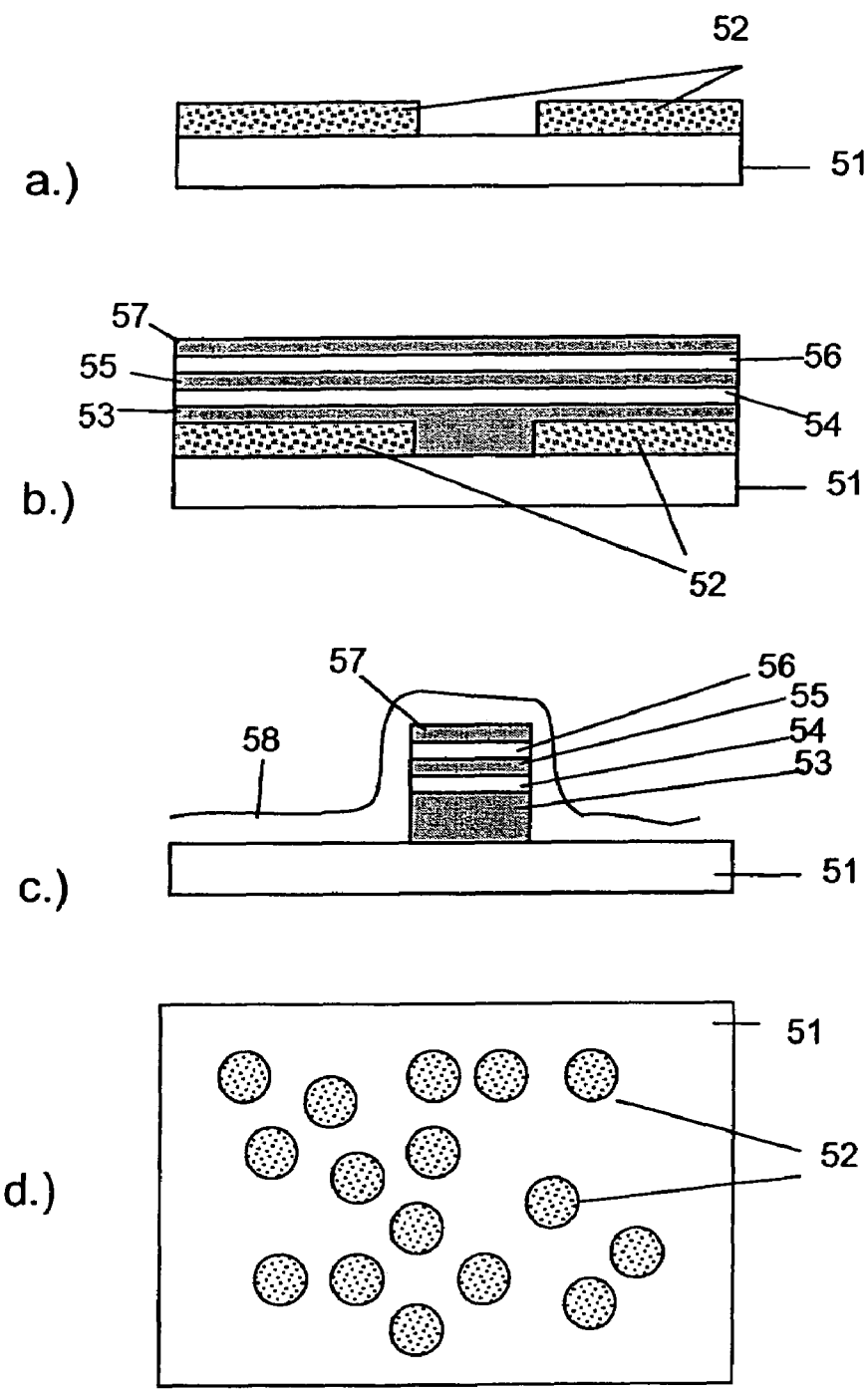
FIG. 5 shows the combination of printing and lift-off used to create vertical OFET structures by patterning simultaneously the vertically aligned source, gate and drain electrodes.

In another embodiment, a vertical OFET structure is formed by patterning simultaneously the vertically aligned source, gate and drain electrodes as shown in FIG. 5. The ink pattern 52 is printed on substrate 51, for example by ink-jet printing. Following this, conductive coatings 53, 55 and 57 are deposited with intervening insulating layers 54 and 56 in the sequence shown. Layers 53-57 may be solution coated or optionally evaporated. Following removal of the printed pattern 52 together with portions of other layers above, the mutilayer structure of 53-57 is formed as shown in FIG. 5c. An organic semiconductor 58 is then deposited, preferably by solution coating. In this vertical OFET, electrodes 53 and 57 are the source and drain and 55 acts as the gate. Thus a printed vertical OFET is realised with a channel length much smaller than otherwise would be possible by conventional direct ink-jet printing. Note that the pattern of 42 or 52 in FIG. 4 or FIG. 5 can be produced even by random droplets, each providing a vertical edge forming a transistor channel as shown in the top view of FIG. 5.*d*. Therefore even 1*f* there is a scatter of the print alignment, vertical transistors with channel lengths in the order of the film thickness e.g. 500 nm can still be realised.

The above process may be used to pattern a multiplicity of overlying and also neighbouring layers in a single step with good alignment. Other printing processes would have serious alignment or registration problems when printing one pattern over another. Using the present method makes it possible to print, for example, "self-aligned" OLED, OFET or other organic devices.

Figure 6:
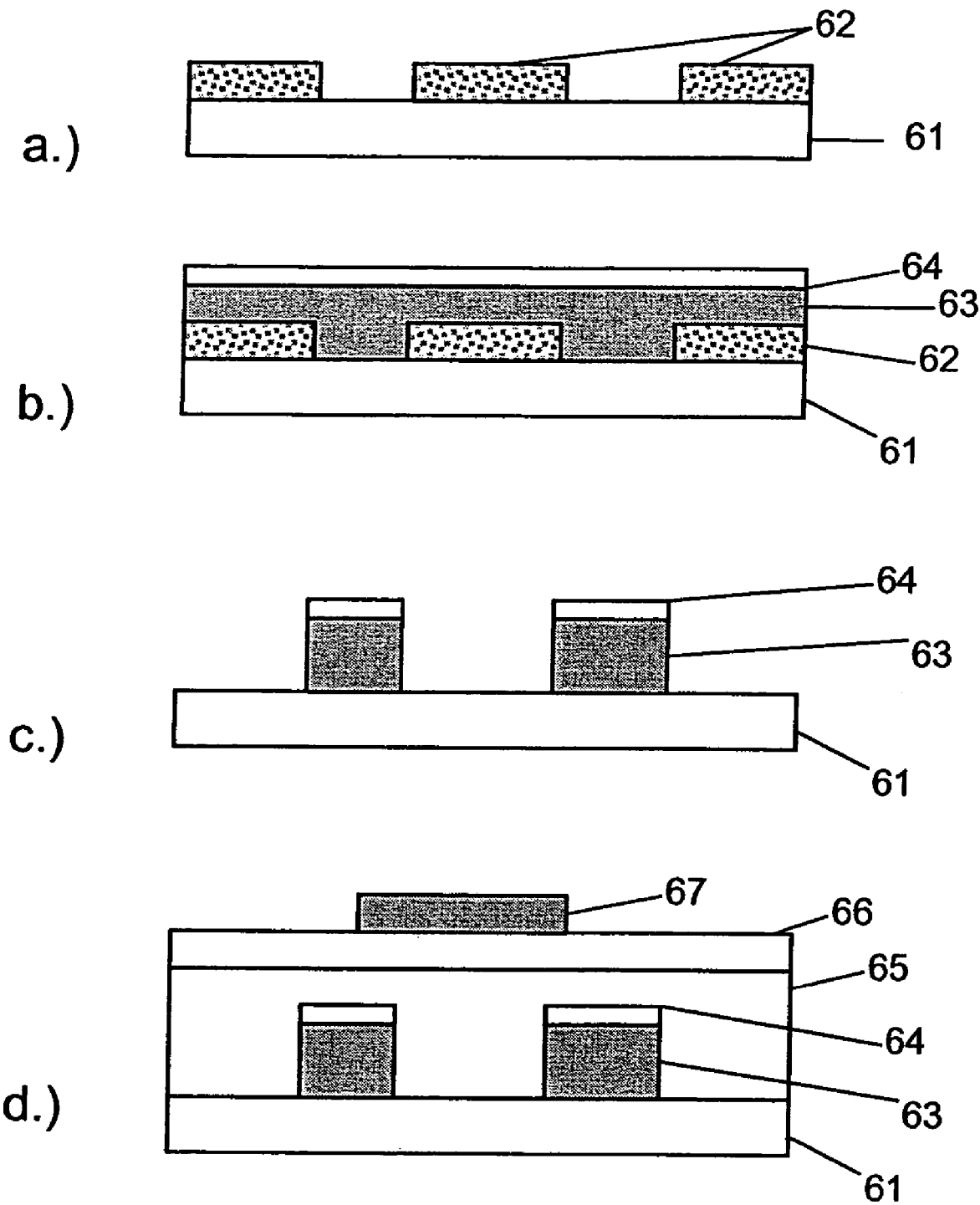
FIG. 6 shows a print process for horizontal self alignment in the plane of the substrate.

In another embodiment, the present invention provides the means to perform doping in a controlled, patterned manner. Often it is desirable to dope locally a semiconductor near contact areas to improve carrier injection. However, ensuring that the dopant is only near the contact is not easy in a printing process. In the process shown in FIG. 6 source and drain electrodes are patterned by printing with a layer of dopant on them. An inert, lift-off ink layer is used to define these electrodes and the doping pattern simultaneously. The ink 62 is printed onto the substrate 61. Next, the electrode material 63 is deposited, for example by spin coating, spraying or evaporation, followed by a thin, 1-20 nm layer of an organic dopant 64. A lift-off step then removes unwanted electrode areas of the electrode material 63 and dopant 64 together with the ink 62 in one step. The resulting electrodes have dopant rich surfaces as shown in FIG. 6*c*. Subsequently the organic semiconductor 65 and gate dielectric 66 are applied, preferably from solution phase. Finally gate electrode 67 is deposited. Local doping in this manner may also be preformed in an OFET channel, or at anode or cathode regions of OLEDs. Analogously, electron or hole blocking layers can also be aligned with contact areas.

Figure 7:
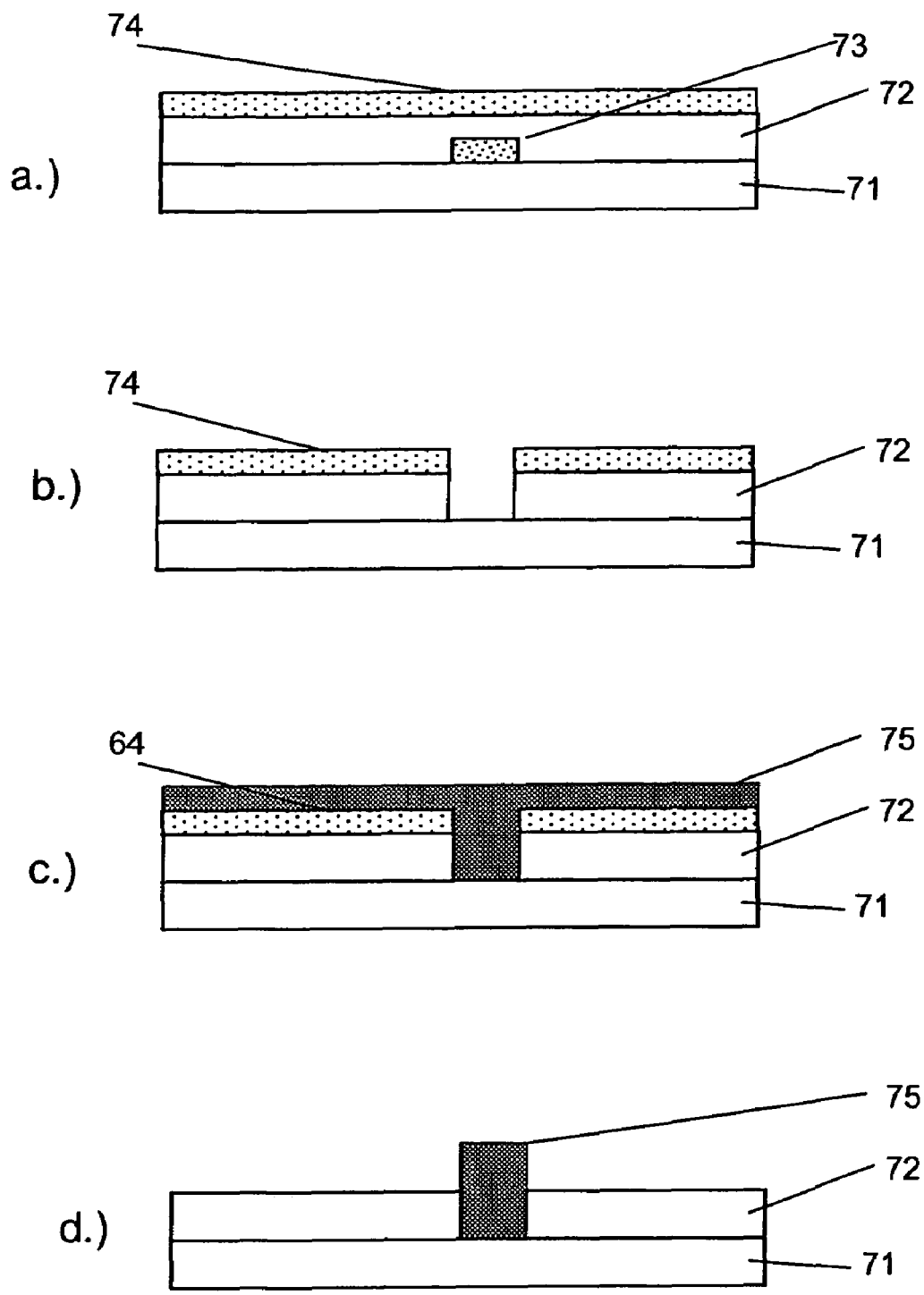
FIG. 7 shows indirect patterning used to achieve vertical self-alignment to print source and drain electrodes covered with a layer of dopant or injection layer or blocking layer.

In a further embodiment two different layers are horizontally aligned using a negative print process. FIG. 7*a* illustrates a substrate 71 with a printed inert ink layer 73. A layer of a semiconductor 72 is coated on the printed pattern. Following this, a further sacrificial layer of another inert material 74 is coated deposited above. By affecting the liftoff of pattern 73, unwanted areas of both 72 and 74 are removed as shown in FIG. 7*b*. Now another semiconductor layer 75 is coated onto the structure as shown in FIG. 7*c*. A second liftoff step (using a different solvent or removal method) removes the remaining portion of inert material 74 together with the areas of 75 above it. Thus, a high degree of alignment between the edges of the semicondcutor layers 72 and 75 is achieved despite the original printing method having low resolution. Note that semiconductors, insulators, conductors, doping materials or blocking layers or their combination may also be patterned this way to obtain horizontal self-alignment. For example, colour pixels of small molecule OLED displays can be formed in close proximity.

Figure 8:
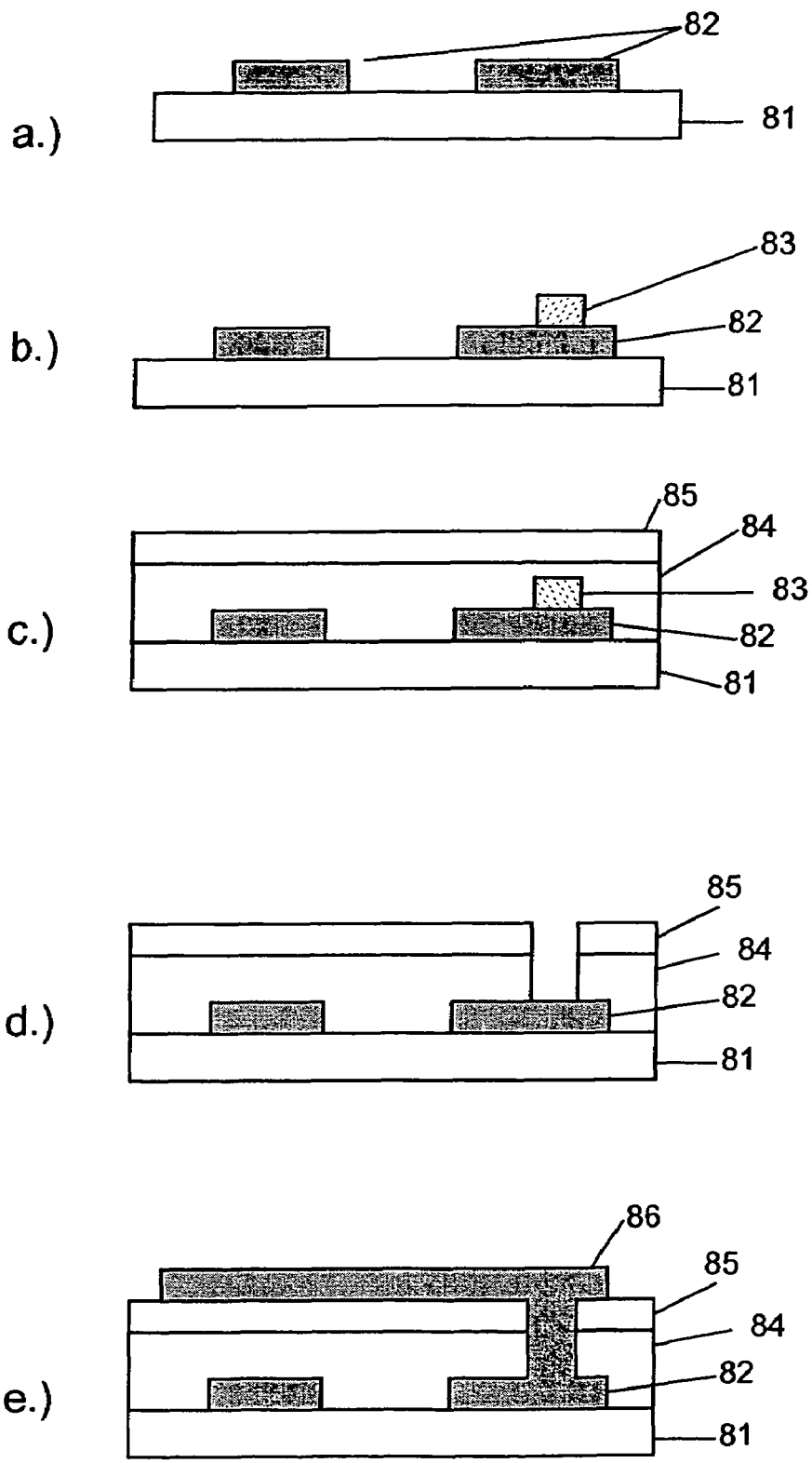
FIG. 8 shows an example of a creating a vertically aligned via.

The printing technique described herein can further be used to create aligned vias in multilayer OFET circuits. For example a single ink-jet dot printed below an interlayer insulator can be used to create an interconnect opening by lift-off. FIG. 8 provides an example of a gate electrode connected to a source of an OFET. Source and drain electrodes 82 are present on substrate 81. The lift-off ink 83 is printed at the desired place for the via on electrode 82. Following the deposition of the semiconductor 84 and the insulator 85 an opening is created through them by lift-off as shown in FIG. 8*d*. Finally a conductive layer 86 is deposited, preferably from solution phase which makes connection to 82. The lift-off pattern for vias may be produced by any printing technique. The insulator itself may be spin or spray coated which ensures its uniformity even for very thin layers. Defect-free direct printing of uniform, thin layers of insulators by ink-jet or screen printing is difficult.

Figure 9:
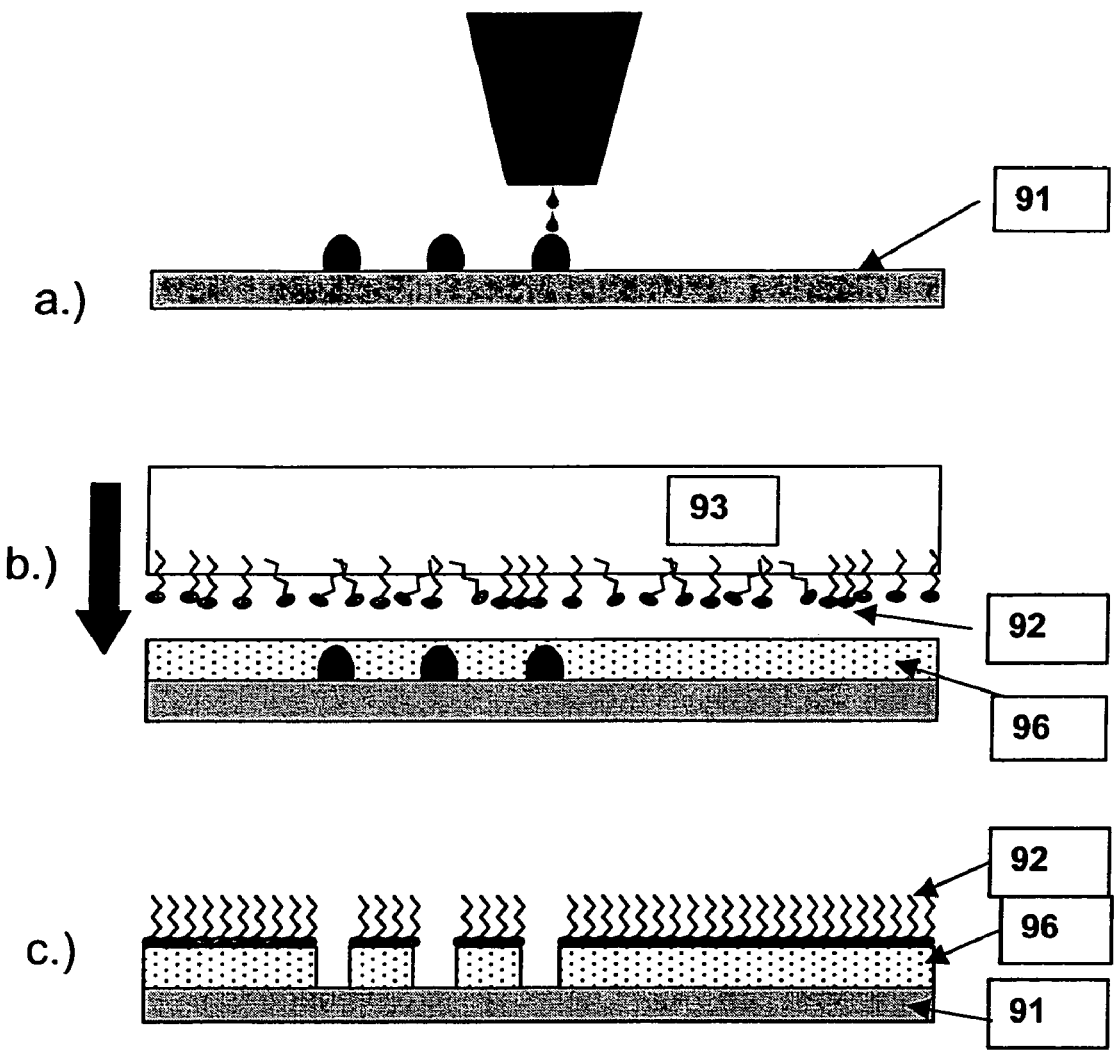
FIG. 9 shows the lift-off method may be used to pattern self-assembled monolayers (SAMs) aligned with a pattern underneath.

The invention may be used to pattern aligned self-assembled monolayers (SAMs). SAMs deposited for example over the channel area of an OFET are often required to improve the orientation of the semiconductor. SAMs may also improve carrier injection into organic materials. However, it would be desirable to ensure that a SAM layer is only deposited over a certain part of the device. In one embodiment of the present invention an organic device element is patterned with a SAM layer on it with excellent alignment. As FIG. 9 illustrates, an inert ink is printed on a surface 91. This is in turn coated with a device layer 96 which is further reacted with molecules that form SAMs. The device layer 96 may be for example indium tin oxide (ITO), a metal (such as gold, silver, or aluminium) or an organic conductor. Suitable SAM molecules 92 can be anything that will covalently (or otherwise) bond with the surface and provide it with resistance against dissolution in an etch solution. The SAM may alternatively have a terminal functionality that promotes wetting (such as OH, COOH) or de-wetting (such as $CH_3$, $CF_3$) in order to pattern a second polymer layer that could serve as an etch mask. The surface is reacted with the SAM either by immersing in a solution of the molecules, placing in a vapour stream of the molecules, or bringing into contact with a planar elastomeric stamp 93 such as polydimethysiloxane (PDMS), which has been coated with the molecules from solution. Once the SAM has formed, the ink, portions of device layer 96 and loosely bound molecules are lifted-off by immersing in a liquid medium to produce the patterned device layer 96 with the SAM 92 aligned to it as shown in FIG. 9*c*.

In certain cases it may be desirable to pattern a SAM on OFET electrodes to change the electrical properties, such as modifying the work function of the electrodes. Layer 96 may be a metal, in which case a patterned anode or cathode or source/drain electrodes are obtained with aligned SAM on them.

The indirect print processes for alignment described here may also be used as a complementary tool together with direct patterning techniques for OFETs e.g. with those described in WO 01/46987 (Plastic Logic, 2001). A particularly advantageous feature of the present method is that the patterning of a number of materials/layers with the same ink is possible. Using the same ink for many different constituent layers is highly advantageous as it greatly simplifies the process. A further advantage of the present indirect process is that the uniformity of the thickness of the printed pattern is not important—unlike when using a direct printing approach. The printed lift-off pattern will provide excellent edge definition even when the printed area is thin at its edges.

EXAMPLES

Example 1

Figure 10:
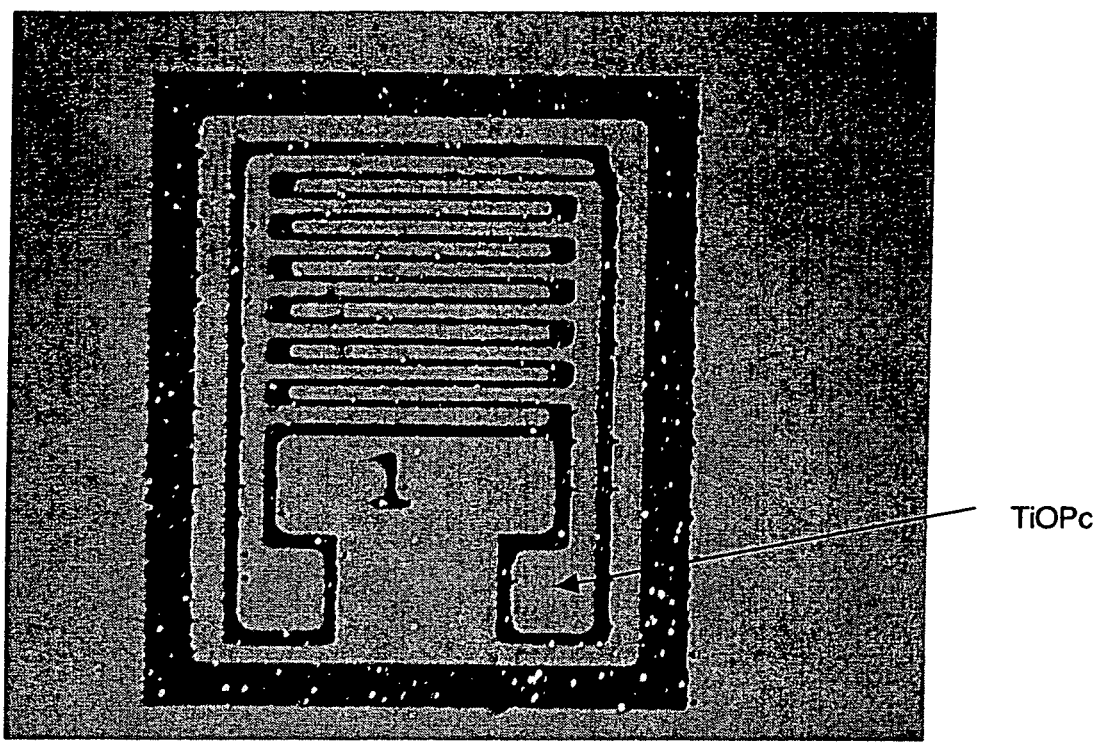
FIG. 10 shows an FET structure (described in Example 1) with a TiOPc charge injection layer deposited on top of Au/Ti layers produced by the ink-jet lift-off method.

Patterning an Injection Layer by the Simultaneous Lift-Off of a Stack of Ti, Au, and TiOPc Charge Generation Layer A negative pattern of the source and drain electrodes of a FET was printed onto a polyester film using an Epson C60 ink-jet printer. The sample was then placed in an Edwards Auto 306 evaporator and 5 nm of Ti followed by 27 nm Au was coated onto the ink. A dispersion of Titanyl oxyphthalocynine TiOPc in butyl acetate was created by shaking 0.46 g TiOPc & 10 g of 2% w/v solution of polyvinyl butyryl with 27 g of 3 mm glass beads in a "red devil" for 1 hour. The TiOPc dispersion was spin coated onto the Au/Ti/ink pattern at 1000 rpm for 20 s and then was immediately sonicated for 20 s in methanol to remove the ink & the overcoated layers in these areas. An image of the coated electrodes is shown in FIG. 10 (NB. gap between lines ~0.1 mm).

As can be seen the TiOPc only coats the electrodes and not the substrate, hence this type of patterning can be used to deposit injection layers (materials that improve charge injection into organic semiconductors) on top of metals that would not normally form ohmic contacts with OSCs in OFET applications. A uniform layer of the TiOPc throughout the OFET channel would most likely increase the off current in the device resulting in a poor on/off ratio hence is not desirable.

Example 2

Preparation of Patterned Poly(N-Methylpyrrole) Films on Pt/Pd by "Lift-Off" Procedure Method of Preparation of Poly(N-Methylpyrrole) Films A 25 nm layer of sputter-coated platinum/palladium was deposited upon a pattern produced by ink-jet printing. This was then immersed in a solution of iron (III) chloride hexahydrate (2.703 g, 0.0 mol) in distilled water (100 mL), which had been previously outgassed with nitrogen. To this solution was added N-methylpyrrole (1 mL, 0.01 mol) and the mixture was maintained at between 25 and 27° C. internal temperature.

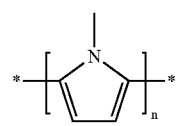

Structure of Poly(N-Methylpyrrole)

Polymerisation of the N-methylpyrrole was immediately initiated by the catalyst solution. The reaction was continued for the required "deposition" time, usually between 30 and 120 mins, before the polymer coated substrate was removed from the reaction mixture, washed with distilled water and ethanol and blown dry with a flow of nitrogen gas. The polymer produced by the above methodology was black in colour and insoluble in all organic solvents.

Figure 11:
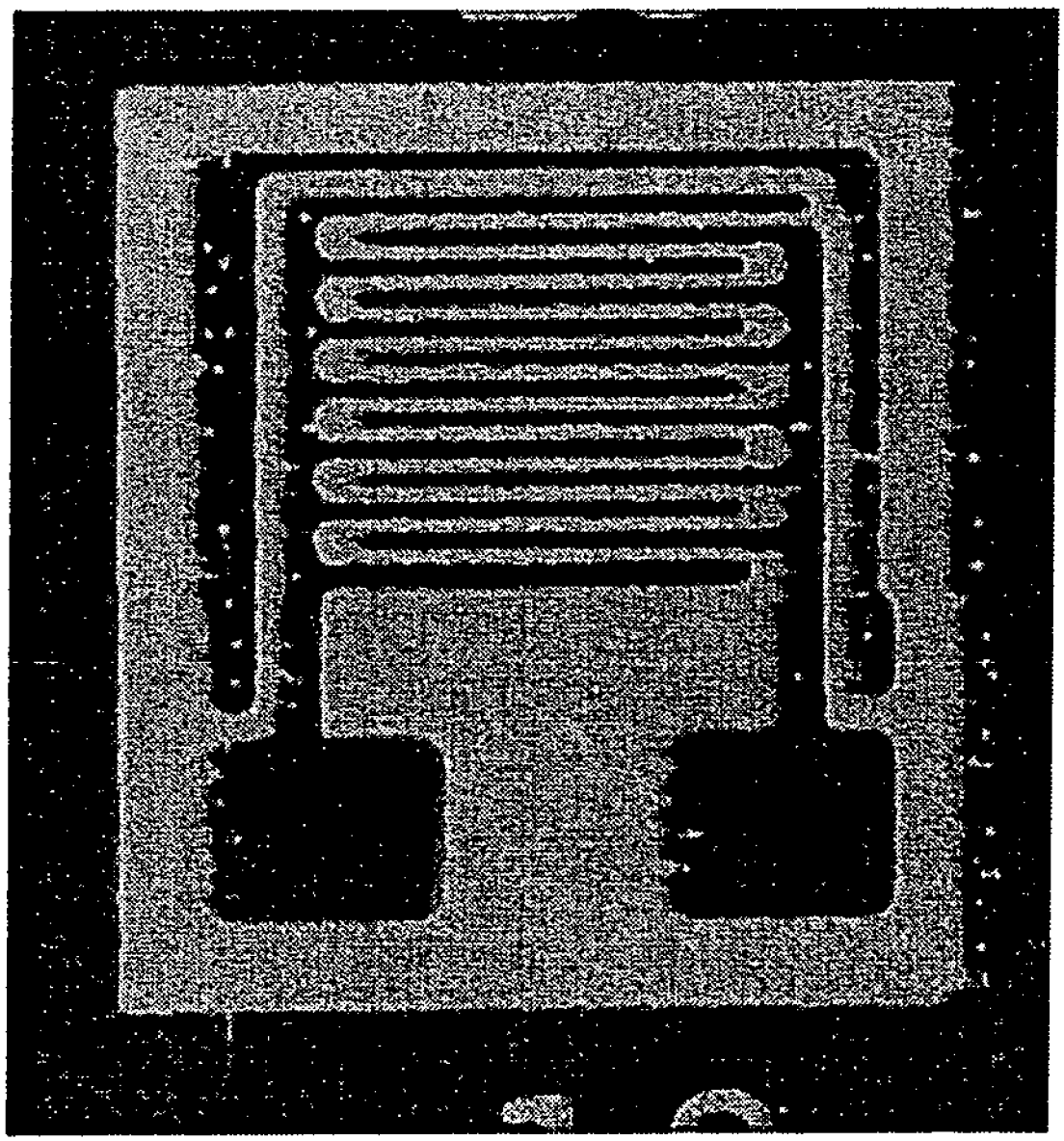
FIG. 11 shows a device structure (described in Example 2) comprising patterned multilayer of Pt/Pd and Poly(N-Methylpyrrole)
Figure 12:
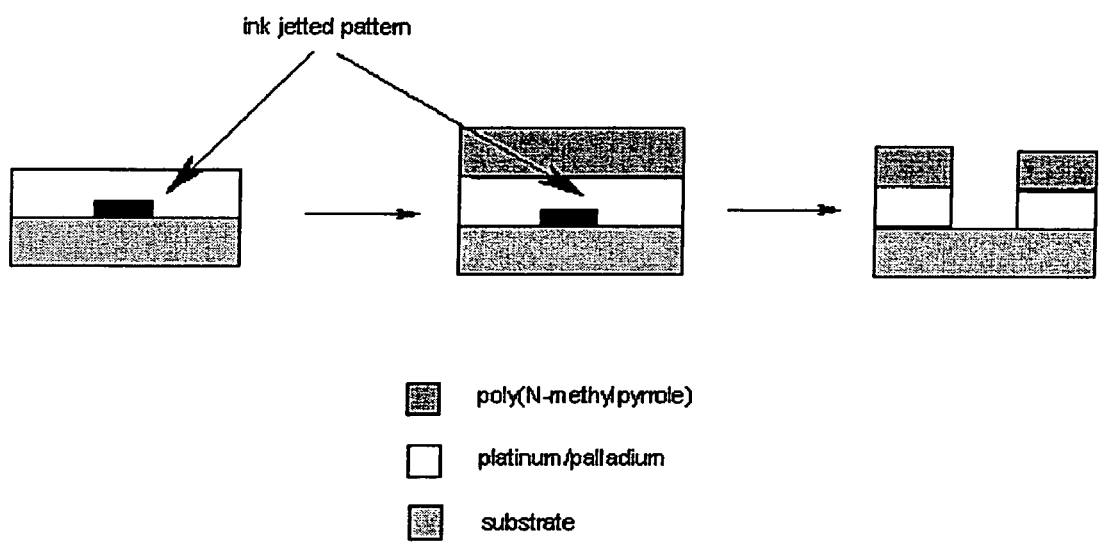
FIG. 12 shows schematically the deposition and lift-off steps in the patterning procedure described in Example 2.

The polymer-coated metallised substrate was placed in a small volume (approximately 100 mL) of methanol and lowered into an ultrasonic bath for 2 minutes. The substrate was then removed and washed with methanol and the process was repeated before the substrate was dried with a stream of compressed air followed by drying in an oven at 100° C. for 5 minutes. At this stage each patterned device was examined by optical microscopy to determine the extent of lift-off and an image of a typical device is shown below (see FIG. 11). It was noted that lift-off was generally very successful in cases where a thin polymer film had been deposited (e.g. 30 mins deposition time). The process is illustrated schematically in FIG. 12.

The deposition of such a layer of polymer can improve the charge injection from a metal to an organic semiconductor. In this case the polymer is a doped and therefore would cause an increase in the off current of an OFET if it were deposited uniformly. Hence by patterning it using the lift-off method the doping only occurs in the region of the electrodes.

Example 3

Patterning Several Layers Simultaneously

Figure 13:
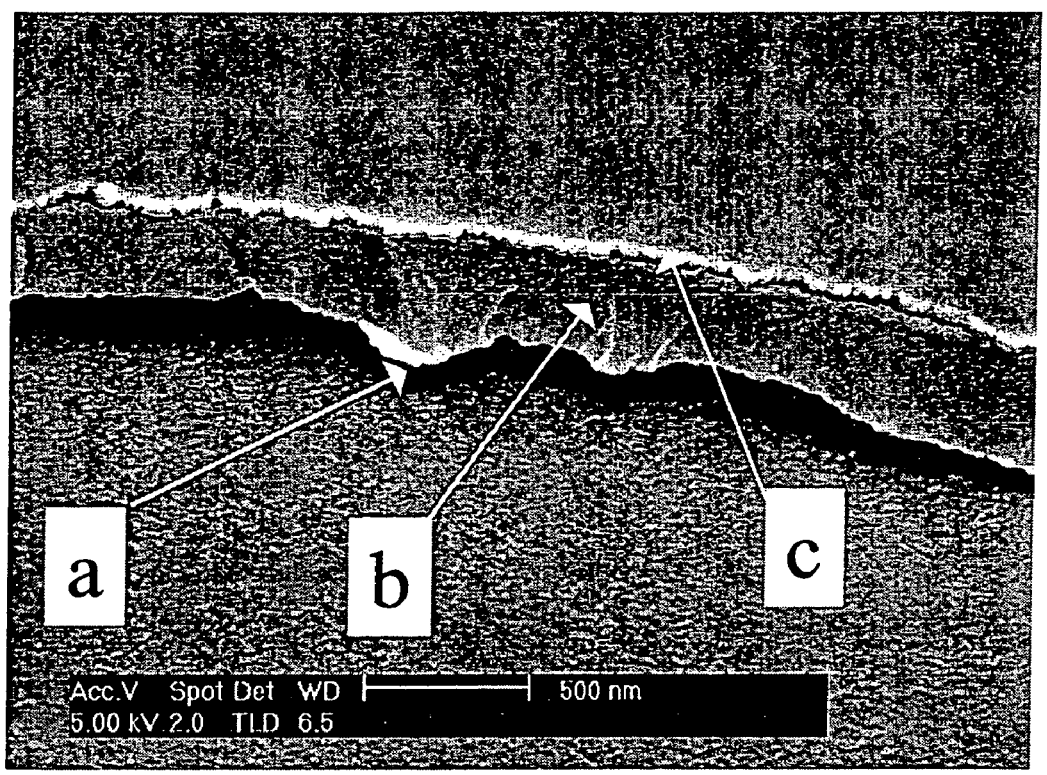
FIG. 13 shows a SEM image of a vertically aligned trilayer structure patterned onto a polyester film (described in Example 3).
Figure 14:
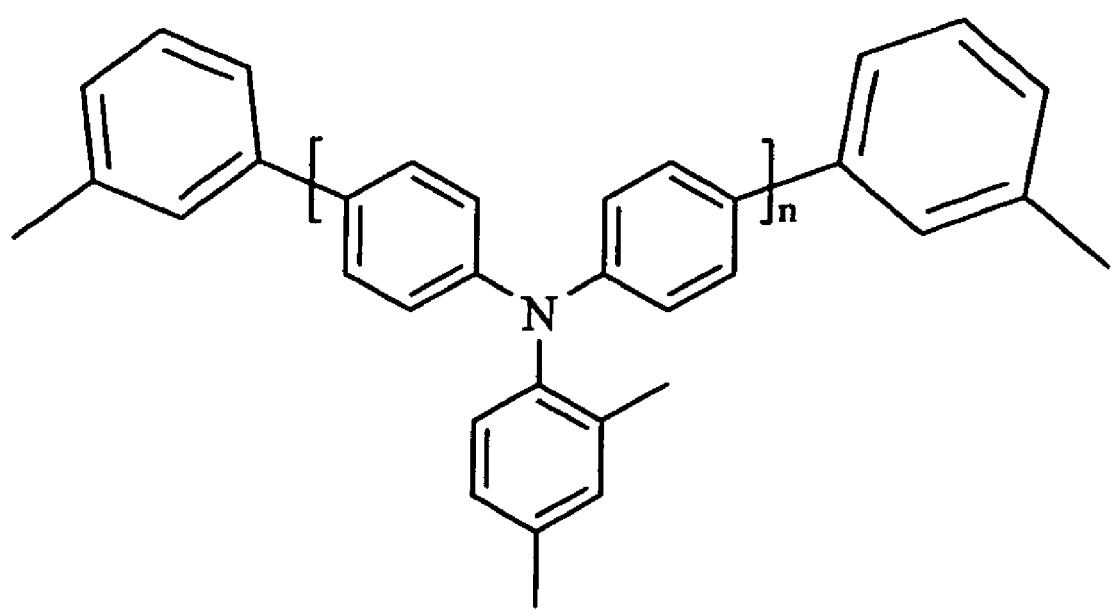
FIG. 14 shows the structure of triarylamine OSC used in Example 3.

Circular spots of ink were printed onto a polyester film using an EPSON C60 ink-jet printer. The film was placed in a sputter coater and 25 nm of Pt/Pd alloy was deposited onto the whole sample. Following this a solution of triarylamine OSC ($M_w$=4000) (FIG. 14) in toluene (5% wt) was deposited on the substrate and spun at 1000 rpm for 15 s to create an approximately 400 nm thick film. The sample was baked at 100° C. for 20 min to evaporate the solvent. A further 25 nm layer of PVPd metal was sputtered over the whole sample. Lift-off of the tri-layer structure was achieved by sonicating in methanol for ~20 s followed by blow drying. A SEM image (FIG. 13) of the structure (taken at 45°) shows each layer of the structure (in FIG. 13 a=first electrode., b=OSC, c=second electrode) aligned at the edge of the lift-off area. This type of patterning may be used to form a vertical transistor with the two electrodes a) and c) serving as source and drain. A layer of insulator may be spun coated over the step, and gate electrode may then be deposited on top. This method allows fabrication of a transistor by printing and reduces the channel length to very small dimensions, in this case to the thickness of the semiconductor layer (i.e. ~400 nm) without the need for high resolution photolithography.

The invention claimed is:

1. A method of forming an organic electronic device, which method comprises the steps of:
    a) forming a negative image of a desired pattern on a substrate or layer of the device with a lift-off ink;
    b) coating a first device layer to be patterned on top of the negative image;
    c) coating one or more further device layers to be patterned on top of the first device layer to be patterned; and
    d) removing the lift-off ink and unwanted portions of the device layers above it, thereby leaving the desired pattern of device layers; and
    e) wherein the organic electronic device comprises a vertical transistor.

2. A method of forming an organic electronic device as claimed in claim 1 wherein the lift-off ink is insoluble in the liquid medium used to deposit the device layers to be patterned.

3. A method of forming an organic electronic device as claimed in claim 1 or 2 wherein the ink comprises a liquid medium which does not dissolve the substrate or layer on which the ink is printed.

4. A method of forming an organic electronic device as claimed in claim 1 wherein the lift-off ink is deposited on the substrate or layer by a direct printing technique selected from the following: ink-jet printing, screen printing, micro-contact printing, stamping, soft lithography or electrophotographic printing using a solid or liquid toner.

5. A method of forming an organic electronic device as claimed in claim 1 wherein the deposited lift-off ink is thicker than the device layers subsequently deposited onto it.

6. A method of forming an organic electronic device as claimed in claim 1 wherein the lift-off pattern is from 1 μm to 50 μm.

7. A method of forming an organic electronic device as claimed in claim 1 wherein the ink is deposited by screen printing and the ink has a viscosity from 500 and 10,000 cP.

8. A method of forming an organic electronic device as claimed in claim 1 wherein the ink is deposited by ink-jet printing and the ink viscosity is in the range from 3 to 40 cP.

9. A method of forming an organic electronic device as claimed in claim 1 wherein the ink has a surface tension in the range of 20-60 dynes/cm.

10. A method of forming an organic electronic device as claimed in claim 1 wherein the surface tension of the ink relative to the substrate is in the range 40-80 deg.

11. A method of forming an organic electronic device as claimed in claim 1 wherein the lift-off ink contains from 50% to 99.8% liquid medium, by weight.

12. A method of forming an organic electronic device as claimed in claim 1 wherein the lift-off ink further comprises a colorant, a polymeric binder or one or more functional additives.

13. A method of forming an organic electronic device as claimed in claim 1 wherein the lift-off ink further comprises a cross-linking agent to permit cross-linking of the printed ink.

14. A method of forming an organic electronic device as claimed in claim 1 wherein partial shrinkage or micro-cracks are induced to allow a lift-off medium to penetrate the ink at the pattern edges or through its surface to aid the lift-off step (d).

15. A method of forming an organic electronic device as claimed in claim 1 wherein wetting of the ink is effected by a surface treatment of the substrate.

16. A method of forming an organic electronic device as claimed in claim 1 wherein the device layers to be patterned are each independently applied by solution-, spin-, spray-, dip-, web-, die- or evaporation coating.

17. A method of forming an organic electronic device as claimed in claim 1 wherein the device layer to be patterned is applied by electroless deposition, ink-jet printing, screen printing, microcontact printing, stamping or soft lithography.

18. A method of forming an organic electronic device as claimed in claim 1 wherein the thickness of each device layer or multiplicity of layers is from 1 nm to 1 μm.

19. A method of forming an organic electronic device as claimed in claim 1 wherein the lift-off step (d) includes dissolving the lift-off ink using a lift-off liquid medium.

20. A method of forming an organic electronic device as claimed in claim 19 wherein the lift-off liquid medium dissolves little or none of the device layer to be patterned.

21. A method of forming an organic electronic device as claimed in claim 19 or 20 wherein the lift-off step (d) further includes ultrasonic agitation, stirring, spraying liquid medium and/or heating.

22. A method of forming an organic electronic device as claimed in claim 1 wherein the device is an OFET and the device layers are each independently selected from a conductor, a dopant, an insulator or an organic semiconductor (OSC).

23. A method of forming an organic electronic device as claimed in claim 22 wherein the device layers include a conductor that is deposited by liquid coating.

24. A method of forming an organic electronic device as claimed in claim 23 wherein the conductor is selected from the group comprising polyaniline, polypyrrole, PEDOT, doped conjugated polymer, or dispersions or pastes of graphite or particles of metal including Au, Ag, Cu, Al, Ni or their mixtures.

25. A method of forming an organic electronic device as claimed in claim 22 wherein the device layers include an OSC comprising a polymer or oligomer including monomers of triarylamine, fluorene, or thiophene, including substituted forms thereof.

26. A method of forming an organic electronic device as claimed in claim 22 wherein the device layers include an OSC comprising pentacene or solution coated precursor pentacene.

27. A method of forming an organic electronic device as claimed in claim 22 wherein the device is a vertical OFET.

28. A method of forming an organic electronic device as claimed in claim 1 wherein the device layers include an OSC, which is deposited from solution.

29. A method of forming an organic electronic device as claimed in claim 1 wherein the step d) forms one or more via openings.

30. A method of forming an organic electronic device as claimed in claim 1 wherein the device is an OLED and at least one of the device layers to be patterned is selected from an anode, a cathode or an electroluminiscent layer.

31. A method of forming an organic electronic device as claimed in claim 30 wherein the electroluminescent layer comprises a substantially organic or organometallic electroluminescent material.

32. A method of forming an organic electronic device as claimed in claim 31 wherein the electroluminescent layer comprises a polymer or oligomer containing monomers of thiophene, phenylene, thiophenevinylene, phenylenevinylene, or fluorene, including substituted forms thereof.

33. A method of forming an organic electronic device as claimed in claim 1 wherein the device is an OLED and at least one of the device layers to be patterned is selected from a hole injecting layer, hole transporting layer, electron injecting layer, electron transporting layer or interconnect.

34. A method of forming an organic electronic device as claimed in claim 1 wherein the device is an OLED and at least one of the device layers to be patterned is a dopant or an insulator.

35. An organic electronic device obtainable by claim 1.

* * * * *